(12) United States Patent
Ota et al.

(10) Patent No.: US 12,188,996 B2
(45) Date of Patent: Jan. 7, 2025

(54) MAGNETIC SENSOR DEVICE

(71) Applicant: TDK CORPORATION, Tokyo (JP)

(72) Inventors: Norikazu Ota, Tokyo (JP); Shinichirou Mochizuki, Tokyo (JP); Kazuya Watanabe, Tokyo (JP); Hiraku Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 170 days.

(21) Appl. No.: 17/948,429

(22) Filed: Sep. 20, 2022

(65) Prior Publication Data

US 2023/0088756 A1    Mar. 23, 2023

Related U.S. Application Data

(60) Provisional application No. 63/246,455, filed on Sep. 21, 2021.

(30) Foreign Application Priority Data

Sep. 2, 2022   (JP) .................... 2022-140031

(51) Int. Cl.
*G01R 33/00* (2006.01)
*G01R 33/09* (2006.01)

(52) U.S. Cl.
CPC ....... *G01R 33/0029* (2013.01); *G01R 33/093* (2013.01); *G01R 33/098* (2013.01)

(58) Field of Classification Search
CPC ............. G01R 33/0029; G01R 33/093; G01R 33/098; G01R 33/0052; G01R 33/0206
See application file for complete search history.

(56) References Cited

U.S. PATENT DOCUMENTS

| | | | |
|---|---|---|---|
| 2006/0168832 A1 | 8/2006 | Yasui et al. | |
| 2006/0176142 A1 | 8/2006 | Naito et al. | |
| 2019/0206602 A1* | 7/2019 | Sasaki | G01R 33/093 |
| 2020/0116801 A1 | 4/2020 | Watanabe et al. | |
| 2020/0256933 A1* | 8/2020 | Saruki | G01D 3/022 |
| 2021/0405132 A1* | 12/2021 | Kubota | G01R 33/0052 |

FOREIGN PATENT DOCUMENTS

| | | |
|---|---|---|
| JP | 2003-240553 A | 8/2003 |
| JP | 2004-012156 A | 1/2004 |
| JP | 2012-185044 A | 9/2012 |
| JP | 2014-006059 A | 1/2014 |
| WO | 2015/125699 A1 | 8/2015 |

\* cited by examiner

*Primary Examiner* — Feba Pothen
(74) *Attorney, Agent, or Firm* — Oliff PLC

(57) ABSTRACT

A magnetic sensor device includes a first detection circuit, a second detection circuit, and a processor. The processor is configured to execute first generation processing for generating a first initial detection value, second generation processing for generating a second initial detection value, first correction processing, second correction processing, and determination processing. The first correction processing is processing for correcting the first initial detection value and updating the first initial detection value. The second correction processing is processing for correcting the second initial detection value and updating the second initial detection value. The processor executes the determination processing after alternately executing the first correction processing and the second correction processing.

15 Claims, 12 Drawing Sheets

MAGNETIC SENSOR DEVICE

CROSS REFERENCE TO RELATED APPLICATIONS

This application claims the benefit of U.S. Provisional Patent Application No. 63/246,455 filed on Sep. 21, 2021 and Japanese Priority Patent Application No. 2022-140031 filed on Sep. 2, 2022, the entire contents of each of which are incorporated herein by their reference.

BACKGROUND

The technology relates to a magnetic sensor device configured to detect a plurality of magnetic fields in a plurality of respective different directions.

Magnetic sensors using magnetoresistive elements have been used for various applications in recent years. A system including a magnetic sensor may be intended to detect a magnetic field containing a component in a direction perpendicular to the surface of a substrate by using a magnetoresistive element provided on the substrate. In such a case, the magnetic field containing the component in the direction perpendicular to the surface of the substrate can be detected by providing a soft magnetic body for converting a magnetic field in the direction perpendicular to the surface of the substrate into a magnetic field in the direction parallel to the surface of the substrate or locating the magnetoresistive element on an inclined surface formed on the substrate.

U.S. Patent Application Publication No. 2006/0176142 A1 discloses a magnetic sensor including an X-axis sensor, a Y-axis sensor, and a Z-axis sensor disposed on a substrate. Magnetoresistive elements constituting the Z-axis sensor are disposed on slopes of projections formed on an underlying film of the substrate.

A magnetic sensor including magnetoresistive elements located on inclined surfaces does not need a soft magnetic body for converting the magnetic field. Meanwhile, the soft magnetic body can function as a shield. More specifically, the soft magnetic body can be configured to have a function of hardly attenuating the magnetic field in the intended direction of detection but cutting off or attenuating magnetic fields in directions other than the intended direction of detection. If the magnetic sensor does not include such a soft magnetic body or shield, the sensitivity of the magnetoresistive elements can change with the magnetic fields in directions other than the intended direction of detection. As a result, the detection accuracy of the magnetic sensor can drop.

SUMMARY

A magnetic sensor device according to one embodiment of the technology includes: a first detection circuit configured to detect a component of a target magnetic field in one direction and generate a first detection signal, the target magnetic field being a magnetic field to be detected; a second detection circuit configured to detect a component of the target magnetic field in another direction and generate a second detection signal; and a processor.

The processor is configured to execute first generation processing for generating a first initial detection value using the first detection signal, second generation processing for generating a second initial detection value using the second detection signal, first correction processing for correcting the first initial detection value using a second correction value generated from a latest one of the second initial detection value, and updating the first initial detection value, second correction processing for correcting the second initial detection value using a first correction value generated from a latest one of the first initial detection value, and updating the second initial detection value, and determination processing for determining the latest one of the first initial detection value as a first detection value having a correspondence with a component of the target magnetic field parallel to a first reference direction, and determining the latest one of the second initial detection value as a second detection value having a correspondence with a component of the target magnetic field parallel to a second reference direction. The processor executes the determination processing after alternately executing the first correction processing and the second correction processing.

In the magnetic sensor device according to one embodiment of the technology, the processor executes the determination processing after alternately executing the first correction processing and the second correction processing. According to one embodiment of the technology, an error due to magnetic fields other than the magnetic field to be detected can be reduced.

Other and further objects, features, and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
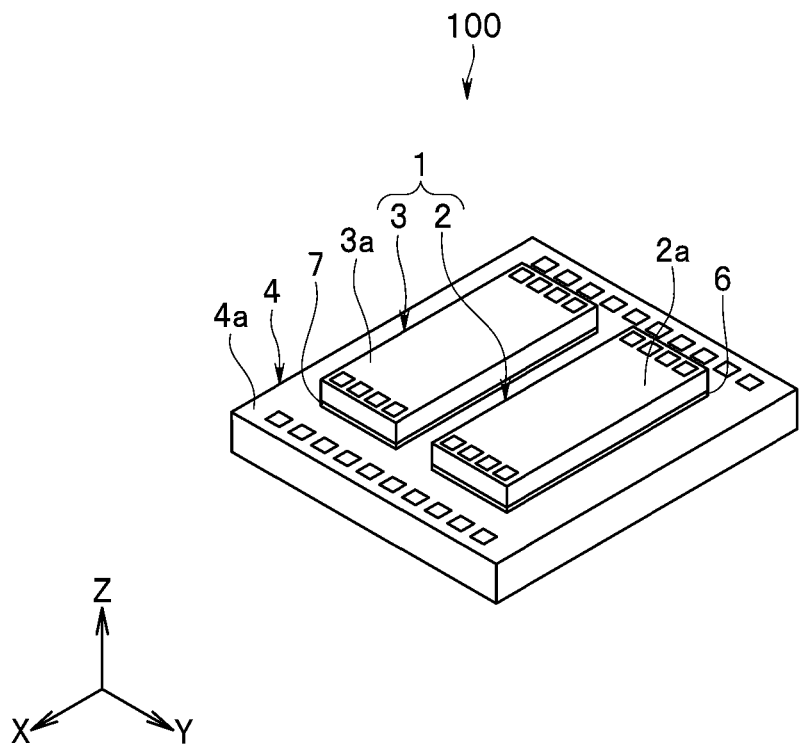
FIG. 1 is a perspective view showing a magnetic sensor device according to a first example embodiment of the technology.

An object of the technology is to provide a magnetic sensor device configured to detect a plurality of magnetic fields in a plurality of respective different directions, where an error due to magnetic fields other than the magnetic field to be detected can be reduced.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

Figure 2:
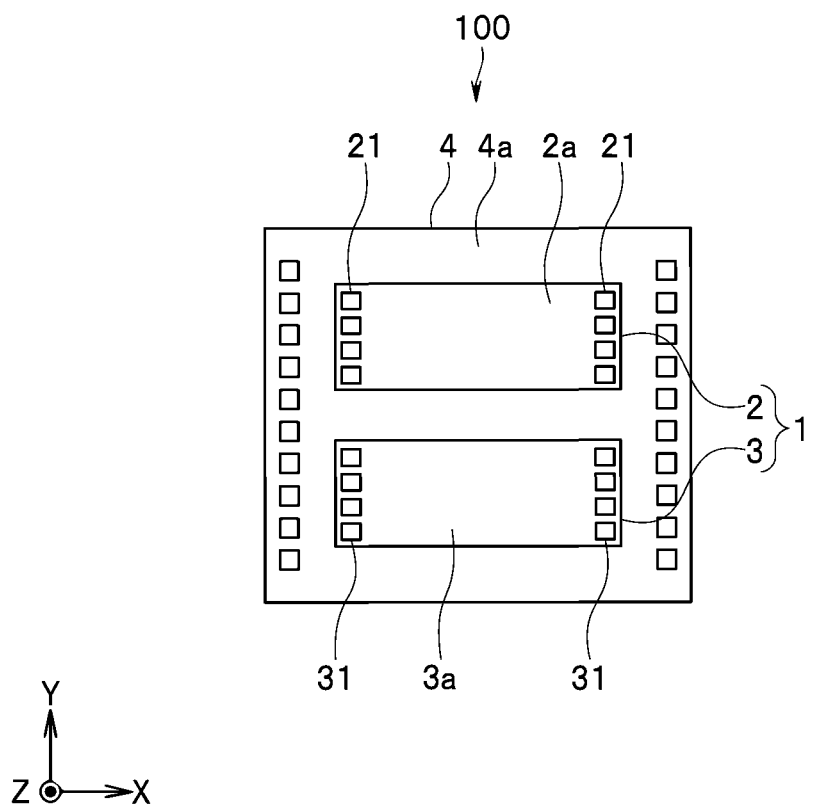
FIG. 2 is a plan view showing the magnetic sensor device according to the first example embodiment of the technology.
Figure 3:
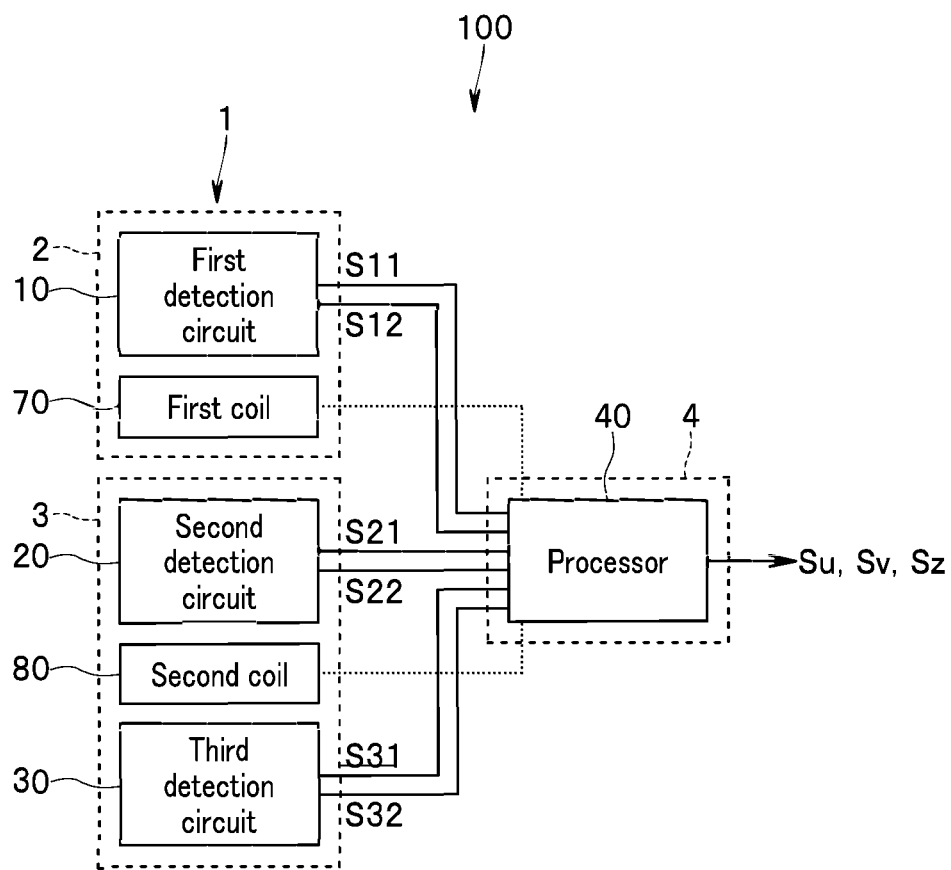
FIG. 3 is a functional block diagram showing a configuration of the magnetic sensor device according to the first example embodiment of the technology.

A configuration of a magnetic sensor device according to a first example embodiment of the technology will initially be described with reference to FIGS. 1 to 3. FIG. 1 is a perspective view showing a magnetic sensor device 100. FIG. 2 is a plan view showing the magnetic sensor device 100. FIG. 3 is a functional block diagram showing a configuration of the magnetic sensor device 100. The magnetic sensor device 100 includes a magnetic sensor 1.

The magnetic sensor device 100 includes a first chip 2, a second chip 3, and a support 4 that supports the first and second chips 2 and 3. The magnetic sensor 1 includes the first chip 2 and the second chip 3. The first chip 2, the second chip 3, and the support 4 each have a rectangular solid shape. The support 4 has a reference plane 4a that is a top surface, a bottom surface located opposite to the reference plane 4a, and four side surfaces connecting the reference plane 4a and the bottom surface.

Now, a description will be given of a reference coordinate system in the present example embodiment with reference to FIGS. 1 and 2. The reference coordinate system is an orthogonal coordinate system that is set with reference to a magnetic sensor device 100 and defined by three axes. An X direction, a Y direction, and a Z direction are defined in the reference coordinate system. The X, Y, and Z directions are orthogonal to each other. In particular, in the example embodiment, a direction that is perpendicular to the reference plane 4a of the support 4 and directed from the bottom surface of the support 4 to the reference plane 4a is referred to as the Z direction. The opposite directions to the X, Y, and Z directions will be expressed as —X, −Y, and −Z directions, respectively. The three axes defining the reference coordinate system are an axis parallel to the X direction, an axis parallel to the Y direction, and an axis parallel to the Z direction.

Hereinafter, the term "above" refers to positions located forward of a reference position in the Z direction, and "below" refers to positions opposite from the "above" positions with respect to the reference position. For each component of the magnetic sensor device 100, the term "top surface" refers to a surface of the component located at the end thereof in the Z direction, and "bottom surface" refers to a surface of the component located at the end thereof in the −Z direction. The expression "when seen in the Z direction" means that the intended object is seen from a position at a distance in the Z direction.

The first chip 2 has a top surface 2a and a bottom surface that are positioned opposite to each other, and four side surfaces connecting the top surface 2a and the bottom surface. The second chip 3 has a top surface 3a and a bottom surface that are positioned opposite to each other, and four side surfaces connecting the top surface 3a and the bottom surface.

The first chip 2 is mounted on the reference plane 4a in a posture such that the bottom surface of the first chip 2 faces the reference plane 4a of the support 4. The second chip 3 is mounted on the reference plane 4a in a posture such that the bottom surface of the second chip 3 faces the reference plane 4a of the support 4. The first chip 2 and the second chip 3 are bonded to the support 4 with, for example, adhesives 6 and 7, respectively.

The first chip 2 has a plurality of first electrode pads 21 disposed on the top surface 2a. The second chip 3 has a plurality of second electrode pads 31 disposed on the top surface 3a. The support 4 has a plurality of third electrode pads disposed on the reference plane 4a. Although not shown, in the magnetic sensor device 100, among the plurality of first electrode pads 21, the plurality of second electrode pads 31, and the plurality of third electrode pads, corresponding two electrode pads are connected with bonding wires.

A dimension in a direction perpendicular to the reference plane 4a is referred to as thickness. As shown in FIG. 1, the thickness of the first chip 2 and the thickness of the second chip 3 may be the same. The thickness of the support 4 is greater than the thickness of the first chip 2 and the thickness of the second chip 3.

The magnetic sensor 1 includes a first detection circuit 10, a second detection circuit 20, and a third detection circuit 30. The first chip 2 includes the first detection circuit 10. The second chip 3 includes the second and third detection circuits 20 and 30. Since the magnetic sensor 1 is a component of the magnetic sensor device 100, the magnetic sensor device 100 can be said to include the first to third detection circuits 10, 20, and 30.

The magnetic sensor device 100 further includes a processor 40. The support 4 includes the processor 40. The first to third detection circuits 10, 20, and 30 and the processor 40 are connected via a plurality of first electrode pads 21, a plurality of second electrode pads 31, a plurality of third electrode pads, and a plurality of bonding wires.

The first to third detection circuits 10, 20, and 30 each include a plurality of magnetic detection elements, and are configured to detect a target magnetic field and generate at least one detection signal. In particular, in the example embodiment, the plurality of magnetic detection elements are a plurality of magnetoresistive elements. The magnetoresistive elements will hereinafter be referred to as MR elements.

The processor 40 is configured to generate a first detection value, a second detection value, and a third detection value by processing the plurality of detection signals generated by the first to third detection circuits 10, 20, and 30. The first, second, and third detection values have a correspondence with components of the magnetic field in three respective different directions at a predetermined reference position. In particular, in the present example embodiment, the foregoing three different directions are two directions parallel to an XY plane and a direction parallel to the Z direction. For example, the processor 40 is constructed of an application-specific integrated circuit (ASIC).

Figure 4:
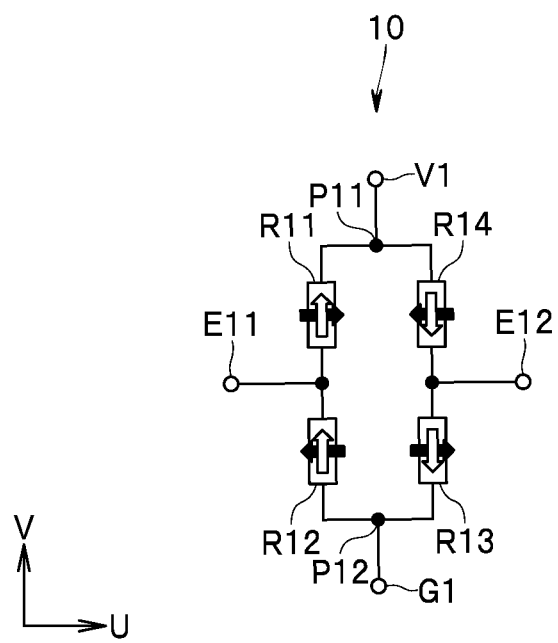
FIG. 4 is a circuit diagram showing a circuit configuration of a first detection circuit of the first example embodiment of the technology.
Figure 5:
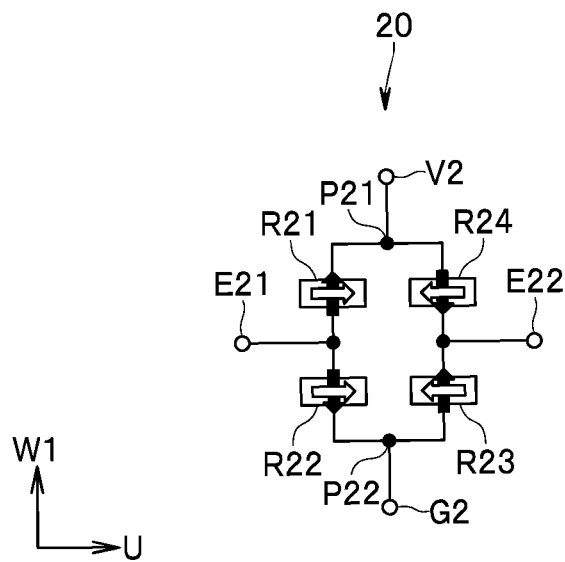
FIG. 5 is a circuit diagram showing a circuit configuration of a second detection circuit of the first example embodiment of the technology.
Figure 6:
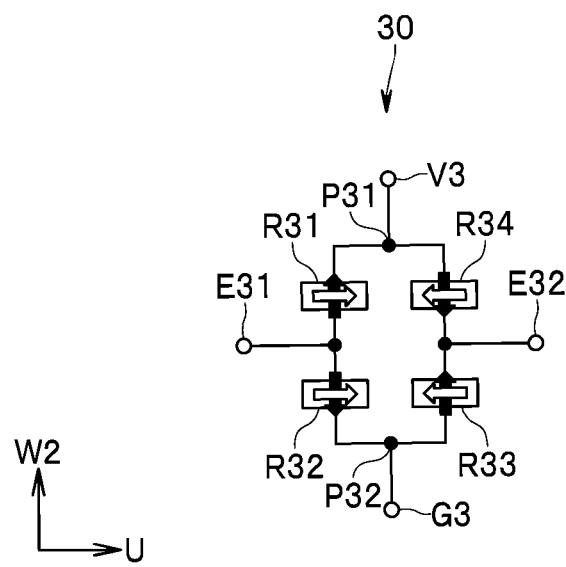
FIG. 6 is a circuit diagram showing a circuit configuration of a third detection circuit of the first example embodiment of the technology.
Figure 7:
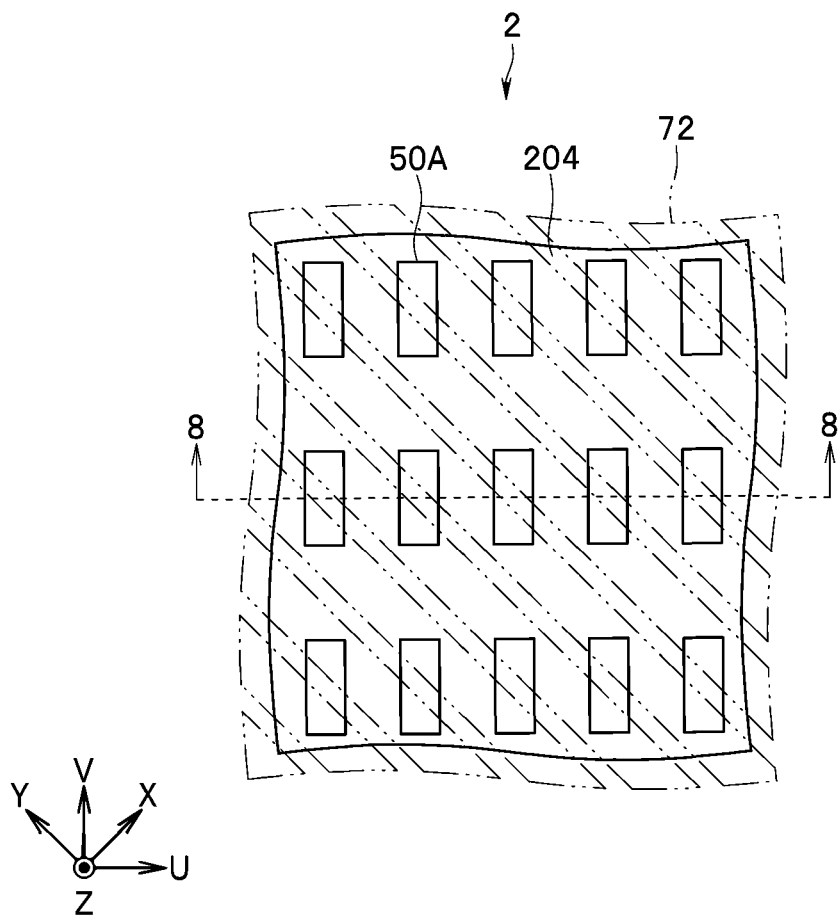
FIG. 7 is a plan view showing a part of a first chip of the first example embodiment of the technology.
Figure 8:
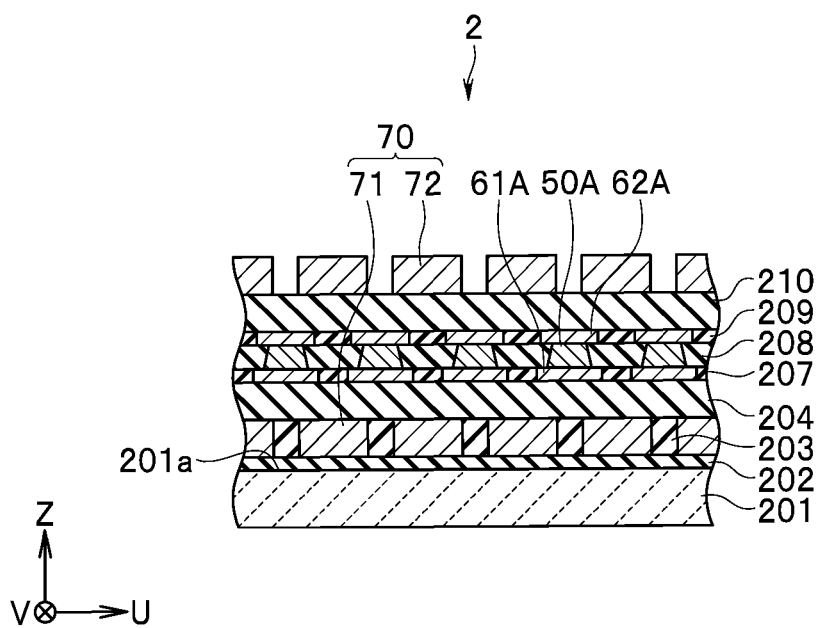
FIG. 8 is a sectional view showing a part of the first chip of the first example embodiment of the technology.
Figure 9:
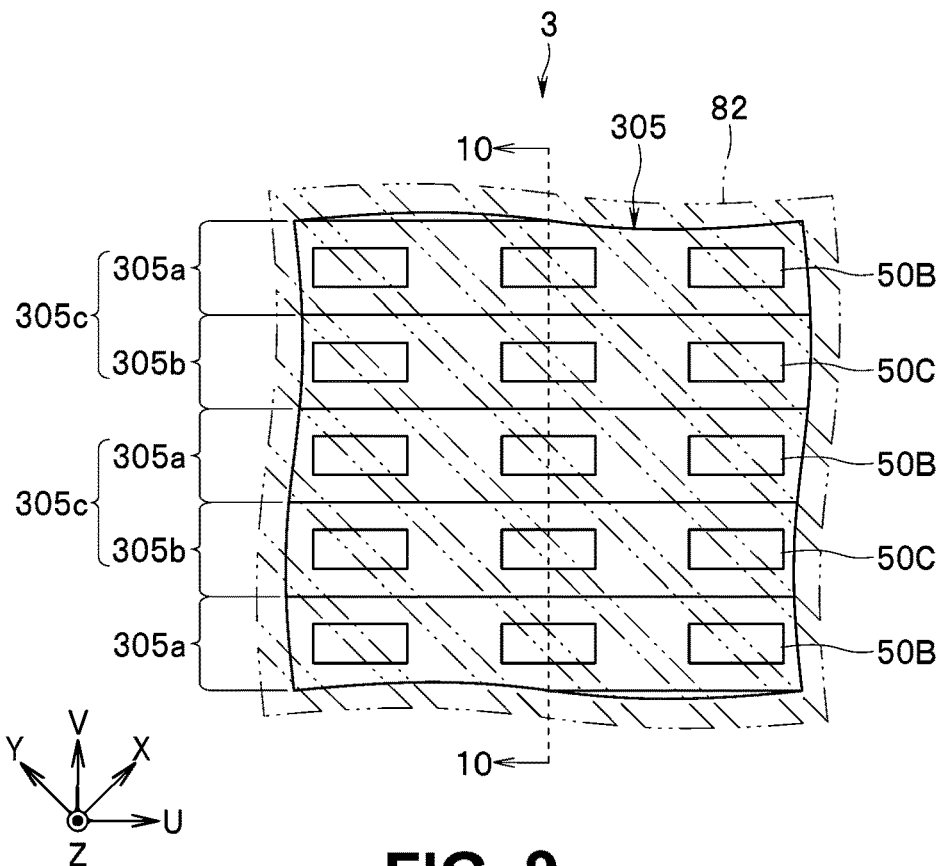
FIG. 9 is a plan view showing a part of a second chip of the first example embodiment of the technology.
Figure 10:
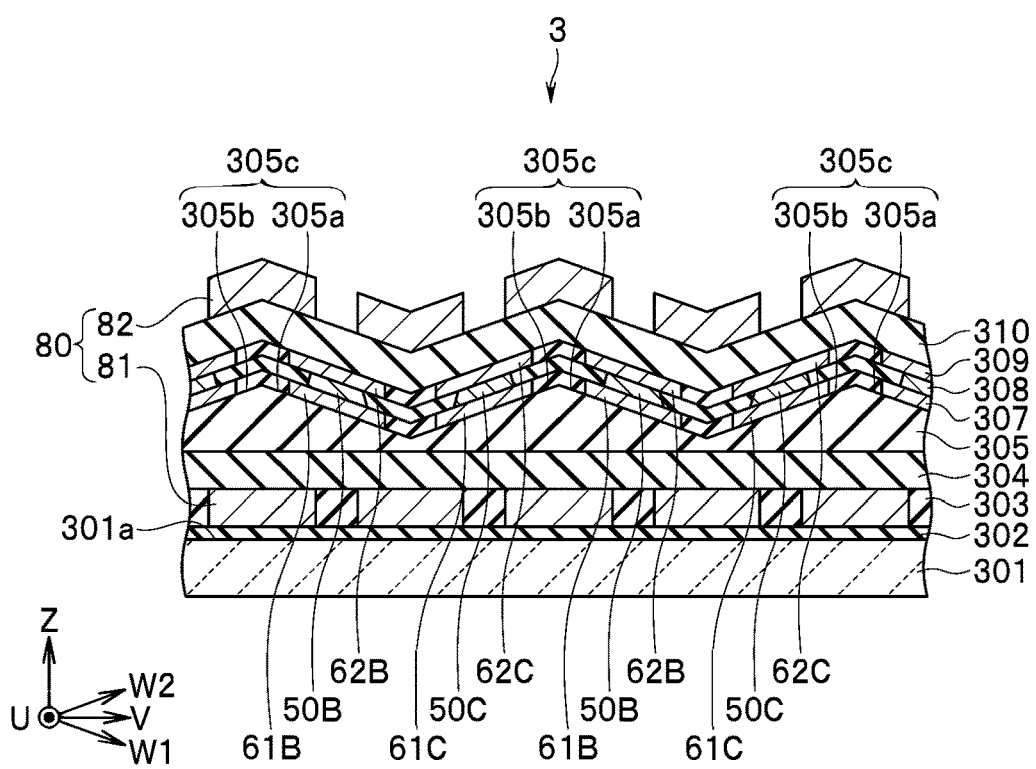
FIG. 10 is a sectional view showing a part of the second chip of the first example embodiment of the technology.

Next, the first to third detection circuits 10, 20, and 30 will be described with reference to FIGS. 3 to 10. FIG. 4 is a circuit diagram showing a circuit configuration of the first detection circuit 10. FIG. 5 is a circuit diagram showing a circuit configuration of the second detection circuit 20. FIG. 6 is a circuit diagram showing a circuit configuration of the third detection circuit 30. FIG. 7 is a plan view showing a part of the first chip 2. FIG. 8 is a sectional view showing a part of the first chip 2. FIG. 9 is a plan view showing a part of the second chip 3. FIG. 10 is a sectional view showing a part of the second chip 3.

Here, as shown in FIGS. 7 and 9, a U direction and a V direction are defined as follows. The U direction is a direction rotated from the X direction to the −Y direction. The V direction is a direction rotated from the Y direction to the X direction. More specifically, in the present example embodiment, the U direction is set to a direction rotated from the X direction to the −Y direction by $\alpha$, and the V direction is set to a direction rotated from the Y direction to the X direction by $\alpha$. Note that $\alpha$ is an angle greater than 0° and smaller than 90°. In one example, $\alpha$ is 45°. −U direction refers to a direction opposite to the U direction, and —V direction refers to a direction opposite to the V direction.

In the example embodiment, the U direction corresponds to the "first reference direction" of the technology. In the example embodiment, the V direction corresponds to the "second reference direction" of the technology. The first reference direction (U direction) and the second reference direction (V direction) are both parallel to the reference plane 4a and are orthogonal to each other.

As shown in FIG. 10, a W1 direction and a W2 direction are defined as follows. The W1 direction is a direction rotated from the V direction to the −Z direction. The W2 direction is a direction rotated from the V direction to the Z direction. More specifically, in the present example embodiment, the W1 direction is set to a direction rotated from the V direction to the −Z direction by $\beta$, and the W2 direction is set to a direction rotated from the V direction to the Z direction by $\beta$. Note that $\beta$ is an angle greater than 0° and smaller than 90°. −W1 direction refers to a direction opposite to the W1 direction, and −W2 direction refers to a direction opposite to the W2 direction. The W1 direction and W2 direction are both orthogonal to the U direction.

The first detection circuit 10 is configured to detect a component of the target magnetic field in a direction parallel to the U direction and generate at least one first detection signal which has a correspondence with the component. The second detection circuit 20 is configured to detect a component of the target magnetic field in a direction parallel to the W1 direction and generate at least one second detection signal which has a correspondence with the component. The third detection circuit 30 is configured to detect a component of the target magnetic field in a direction parallel to the W2 direction and generate at least one third detection signal which has a correspondence with the component.

As shown in FIG. 4, the first detection circuit 10 includes a power supply port V1, a ground port G1, signal output ports E11 and E12, a first resistor section R11, a second resistor section R12, a third resistor section R13, and a fourth resistor section R14. The plurality of MR elements of the first detection circuit 10 constitute the first to fourth resistor sections R11, R12, R13, and R14.

The first and second resistor sections R11 and R12 are connected in series in a first path (left path in FIG. 4) that electrically connects a first node P11 and a second node P12. The third and fourth resistor sections R13 and R14 are connected in series in a second path (right path in FIG. 4) that electrically connects the first node P11 and the second node P12.

The first and fourth resistor sections R11 and R14 are connected to the first node P11. The second and third resistor sections R12 and R13 are connected to the second node P12. The first node P11 is connected to the power supply port V1. The second node P12 is connected to the ground port G1. The connection point between the first resistor section R11 and the second resistor section R12 is connected to the signal output port E11. The connection point between the third resistor section R13 and the fourth resistor section R14 is connected to the signal output port E12.

As shown in FIG. 5, the second detection circuit 20 includes a power supply port V2, a ground port G2, signal output ports E21 and E22, a first resistor section R21, a second resistor section R22, a third resistor section R23, and a fourth resistor section R24. The plurality of MR elements of the second detection circuit 20 constitute the first to fourth resistor sections R21, R22, R23, and R24.

The second detection circuit 20 has basically the same circuit configuration as that of the first detection circuit 10. The description of the circuit configuration of the first detection circuit 10 applies to the circuit configuration of the second detection circuit 20 if the power supply port V1, the ground port G1, the signal output ports E11 and E12, the resistor sections R11, R12, R13, and R14, and the nodes P11 and P12 in the description are replaced with a power supply port V2, a ground port G2, signal output ports E21 and E22, resistor sections R21, R22, R23, and R24, and nodes P21 and P22, respectively.

As shown in FIG. 6, the third detection circuit 30 includes a power supply port V3, a ground port G3, signal output ports E31 and E32, a first resistor section R31, a second resistor section R32, a third resistor section R33, and a fourth resistor section R34. The plurality of MR elements of the third detection circuit 30 constitute the first to fourth resistor sections R31, R32, R33, and R34.

The third detection circuit 30 has basically the same circuit configuration as that of the first detection circuit 10. The description of the circuit configuration of the first detection circuit 10 applies to the circuit configuration of the third detection circuit 30 if the power supply port V1, the ground port G1, the signal output ports E11 and E12, the resistor sections R11, R12, R13, and R14, and the nodes P11 and P12 in the description are replaced with a power supply port V3, a ground port G3, signal output ports E31 and E32, resistor sections R31, R32, R33, and R34, and nodes P31 and P32, respectively.

A voltage or current of predetermined magnitude is applied to each of the power supply ports V1 to V3. Each of the ground ports G1 to G3 is connected to the ground.

The plurality of MR elements of the first detection circuit 10 will be hereinafter be referred to as a plurality of first MR elements 50A. The plurality of MR elements of the second detection circuit 20 will be referred to as a plurality of second MR elements 50B. The plurality of MR elements of the third detection circuit 30 will be referred to as a plurality of third MR elements 50C. Since the first to third detection circuits 10, 20, and 30 are components of the magnetic sensor 1, it can be said that the magnetic sensor 1 includes the plurality of first MR elements 50A, the plurality of second MR elements 50B, and the plurality of third MR elements 50C. Any given MR element will be denoted by the reference numeral 50.

Figure 11:
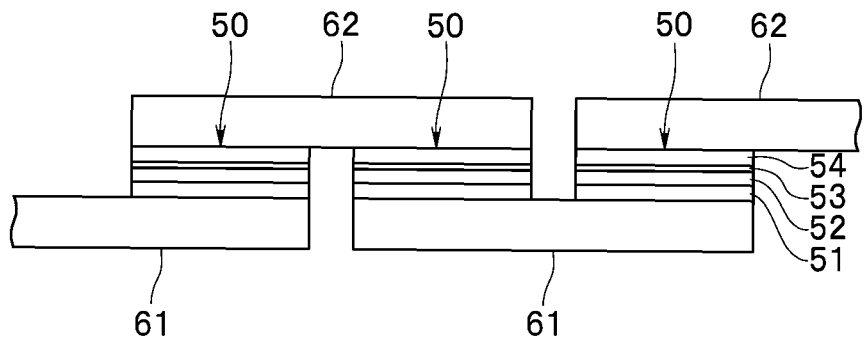
FIG. 11 is a side view showing a magnetoresistive element of the first example embodiment of the technology.

FIG. 11 is a side view showing an MR element 50. The MR element 50 is specifically a spin-valve MR element. The MR element 50 includes a magnetization pinned layer 52 having a magnetization whose direction is fixed, a free layer 54 having a magnetization whose direction is variable depending on the direction of a target magnetic field, and a gap layer 53 located between the magnetization pinned layer 52 and the free layer 54. The MR element 50 may be a tunneling magnetoresistive (TMR) element or a giant magnetoresistive (GMR) element. In the TMR element, the gap layer 53 is a tunnel barrier layer. In the GMR element, the gap layer 53 is a nonmagnetic conductive layer. The resistance of the MR element 50 changes with the angle that the magnetization direction of the free layer 54 forms with respect to the magnetization direction of the magnetization pinned layer 52. The resistance of the MR element 50 is at its minimum value when the foregoing angle is 0°, and at its maximum value when the foregoing angle is 180°. In each MR element 50, the free layer 54 has a shape anisotropy that sets the direction of the magnetization easy axis to be orthogonal to the magnetization direction of the magnetization pinned layer 52. As a method for setting the magnetization easy axis in a predetermined direction in the free layer 54, a magnet configured to apply a bias magnetic field to the free layer 54 can be used.

The MR element 50 further includes an antiferromagnetic layer 51. The antiferromagnetic layer 51, the magnetization pinned layer 52, the gap layer 53, and the free layer 54 are stacked in this order. The antiferromagnetic layer 51 is formed of an antiferromagnetic material, and is in exchange coupling with the magnetization pinned layer 52 to thereby pin the magnetization direction of the magnetization pinned layer 52. The magnetization pinned layer 52 may be a so-called self-pinned layer (Synthetic Ferri Pinned layer, SFP layer). The self-pinned layer has a stacked ferri structure in which a ferromagnetic layer, a nonmagnetic intermediate layer, and a ferromagnetic layer are stacked, and the two ferromagnetic layers are antiferromagnetically coupled. In a case where the magnetization pinned layer 52 is the self-pinned layer, the antiferromagnetic layer 51 may be omitted.

It should be appreciated that the layers 51 to 54 of each MR element 50 may be stacked in the reverse order to that shown in FIG. 11.

In FIGS. 4 to 6, solid arrows represent the magnetization directions of the magnetization pinned layers 52 of the MR elements 50. Hollow arrows represent the magnetization directions of the free layers 54 of the MR elements 50 in a case where no target magnetic field is applied to the MR elements 50.

A first magnetization direction, a second magnetization direction, a third magnetization direction, and a fourth magnetization direction will be defined as follows. The first magnetization direction is a direction intersecting an axis parallel to the Z direction (hereinafter, referred to as a Z-axis). The second magnetization direction is a direction that intersects the Z-axis and is opposite to the first magnetization direction. The third magnetization direction is a direction that intersects the Z-axis and is orthogonal to the first magnetization direction. The fourth magnetization direction is a direction that interests the Z-axis and is opposite to the third magnetization direction.

In the first detection circuit 10, the first magnetization direction is the U direction, the second magnetization direction is the −U direction, the third magnetization direction is the V direction, and the fourth magnetization direction is the —V direction. In the example shown in FIG. 4, the magnetization of the magnetization pinned layer 52 in each of the first and third resistor sections R11 and R13 includes a component in the first magnetization direction (U direction). The magnetization of the magnetization pinned layer 52 in each of the second and fourth resistor sections R12 and R14 includes a component in the second magnetization direction (−U direction).

In the example shown in FIG. 4, the magnetization of the free layer 54 in each of the first and second resistor sections R11 and R12 includes a component in the third magnetization direction (V direction) in the case where the target magnetic field is not applied to the plurality of first MR elements 50A. The magnetization of the free layer 54 in each of the third and fourth resistor sections R13 and R14 includes a component in the fourth magnetization direction (−V direction) in the case where the target magnetic field is not applied to the first MR elements 50A.

If the magnetization of a magnetization pinned layer 52 includes a component in a specific magnetization direction, the component in the specific magnetization direction may be the main component of the magnetization of the magnetization pinned layer 52. Alternatively, the magnetization of the magnetization pinned layer 52 may be free of a component in the direction orthogonal to the specific magnetization direction. In the present example embodiment, if the magnetization of a magnetization pinned layer 52 includes a component in a specific magnetization direction, the magnetization direction of the magnetization pinned layer 52 is the same or substantially the same as the specific magnetization direction.

Similarly, if the magnetization of a free layer 54 in a case where the target magnetic field is not applied to the free layer 54 includes a component in a specific magnetization direction, the component in the specific magnetization direction may be the main component of the magnetization of the free layer 54. Alternatively, the magnetization of the free layer 54 in the foregoing case may be free of a component in a direction orthogonal to the specific magnetization direction. In the present example embodiment, if the magnetization of the free layer 54 in the foregoing case includes a component in a specific magnetization direction, the magnetization direction of the free layer 54 in the foregoing case is the same or substantially the same as the specific magnetization direction.

The first detection circuit 10 is configured so that the free layers 54 are magnetized in the foregoing respective directions in a case where the target magnetic field is not applied to the first detection circuit 10. Specifically, the free layer 54 in each of the plurality of first MR elements 50A of the first detection circuit 10 has a shape anisotropy that sets the direction of the magnetization easy axis to a direction parallel to the third magnetization direction (V direction). The direction parallel to the third magnetization direction (V direction) is also parallel to the fourth magnetization direction (−V direction).

In the second detection circuit 20, the first magnetization direction is the W1 direction, the second magnetization direction is the −W1 direction, the third magnetization direction is the U direction, and the fourth magnetization direction is the −U direction. The description of the magnetization directions of the magnetization pinned layers 52 and the magnetization directions of the free layers 54 in the first detection circuit 10 applies to the magnetization directions of the magnetization pinned layers 52 and the magnetization directions of the free layers 54 in the second detection circuit 20 if the first detection circuit 10, the resistor sections R11, R12, R13, and R14, the first MR elements 50A, the U direction, the −U direction, the V direction, and the —V direction in the description are replaced with the second detection circuit 20, the resistor sections R21, R22, R23, and R24, the second MR elements 50B, the W1 direction, the −W1 direction, the U direction, and the −U direction, respectively.

In the third detection circuit 30, the first magnetization direction is the W2 direction, the second magnetization direction is the −W2 direction, the third magnetization direction is the U direction, and the fourth magnetization direction is the −U direction. The description of the magnetization directions of the magnetization pinned layers 52 and the magnetization directions of the free layers 54 in the first detection circuit 10 applies to the magnetization directions of the magnetization pinned layers 52 and the magnetization directions of the free layers 54 in the third detection circuit 30 if the first detection circuit 10, the resistor sections R11, R12, R13, and R14, the first MR elements 50A, the U direction, the −U direction, the V direction, and the —V direction in the description are replaced with the third detection circuit 30, the resistor sections R31, R32, R33, and R34, the third MR elements 50C, the W2 direction, the −W2 direction, the U direction, and the −U direction, respectively.

The magnetic sensor 1 includes a magnetic field generator configured to apply a magnetic field in a predetermined direction to the free layer 54 of each of the plurality of first MR elements 50A, the plurality of second MR elements 50B, and the plurality of third MR elements 50C. In the present example embodiment, the magnetic field generator includes a first coil 70 that applies a magnetic field in the predetermined direction to the free layer 54 in each of the first MR elements 50A, and a second coil 80 that applies a magnetic field in the predetermined direction to the free layer 54 in each of the plurality of second MR elements 50B and the plurality of third MR elements 50C. The first chip 2 includes the first coil 70. The second chip 3 includes the second coil 80.

A specific structure of the first and second chips 2 and 3 will be described in detail below. First, a structure of the first chip 2 will be described with reference to FIGS. 7 and 8. FIG. 8 shows a part of a cross section at the position indicated by the line 8-8 in FIG. 7.

The first chip 2 includes a substrate 201 having a top surface 201a, insulating layers 202, 203, 204, 207, 208, 209, and 210, a plurality of lower electrodes 61A, a plurality of upper electrodes 62A, a plurality of lower coil elements 71, and a plurality of upper coil elements 72. The top surface 201a of the substrate 201 is parallel to the XY plane. The Z direction is also a direction perpendicular to the top surface 201a of the substrate 201. The coil elements are a part of the coil winding.

The insulating layer 202 is disposed on the substrate 201. The plurality of lower coil elements 71 are disposed on the insulating layer 202. The insulating layer 203 is disposed around the plurality of lower coil elements 71 on the insulating layer 202. The insulating layer 204 is disposed on the plurality of lower coil elements 71 and the insulating layer 203.

The plurality of lower electrodes 61A are disposed on the insulating layer 204. The insulating layer 207 is disposed around the plurality of lower electrodes 61A on the insulating layer 204. The plurality of first MR elements 50A are disposed on the plurality of lower electrodes 61A. The insulating layer 208 is disposed around the plurality of first MR elements 50A on the plurality of lower electrodes 61A and the insulating layer 207. The plurality of upper electrodes 62A are disposed on the plurality of first MR elements 50A and the insulating layer 208. The insulating layer 209 is disposed around the plurality of upper electrodes 62A on the insulating layer 208.

The insulating layer 210 is disposed on the plurality of upper electrodes 62A and the insulating layer 209. The plurality of upper coil elements 72 are disposed on the insulating layer 210. The first chip 2 may further include a not-shown insulating layer that covers the plurality of upper coil elements 72 and the insulating layer 210. FIG. 7 shows the insulating layer 204, the plurality of first MR elements 50A, and the plurality of upper coil elements 72 among the components of the first chip 2.

The top surface 201a of the substrate 201 is parallel to the XY plane. The top surface of each of the plurality of lower electrodes 61A is also parallel to the XY plane. In the foregoing state, the plurality of first MR elements 50A can therefore be said to be disposed on a flat surface parallel to the XY plane.

As shown in FIG. 7, the plurality of first MR elements 50A are disposed so that two or more MR elements 50A are arranged both in the U direction and in the V direction. The plurality of first MR elements 50A are connected in series by the plurality of lower electrodes 61A and the plurality of upper electrodes 62A. When seen in the Z direction, two adjoining first MR elements 50A may be at different positions or the same position in the direction parallel to the V direction.

A method for connecting the plurality of first MR elements 50A will now be described in detail with reference to FIG. 11. In FIG. 11, the reference numerals 61 denote lower electrodes corresponding to given MR elements 50, and the reference numerals 62 denote upper electrodes corresponding to the MR elements 50. As shown in FIG. 11, each lower electrode 61 has a long slender shape. Two lower electrodes 61 adjoining in the longitudinal direction of the lower electrodes 61 have a gap therebetween. MR elements 50 are disposed near both longitudinal ends on the top surface of each lower electrode 61. Each upper electrode 62 has a long slender shape, and electrically connects two adjoining MR elements 50 that are disposed on two lower electrodes 61 adjoining in the longitudinal direction of the lower electrodes 61.

Although not shown in the drawings, an MR element 50 located at the end of a row of MR elements 50 is connected to another MR element 50 located at the end of another row of MR elements 50 adjoining in a direction intersecting with the longitudinal direction of the lower electrodes 61. The two MR elements 50 are connected to each other by a not-shown electrode. The not-shown electrode may be an electrode connecting the bottom surfaces of the two MR elements 50 or the upper surfaces of the same.

If the MR elements 50 shown in FIG. 11 are first MR elements 50A, the lower electrodes 61 shown in FIG. 11 correspond to lower electrodes 61A, and the upper electrodes 62 shown in FIG. 11 correspond to upper electrodes 62A. In such a case, the longitudinal direction of the lower electrodes 61 is parallel to the V direction.

In the example embodiment, an MR element 50 is described to be a stacked film including an antiferromagnetic layer 51, a magnetization pinned layer 52, a gap layer 53, and a free layer 54. However, the one including the stacked film, a lower electrode 61, and an upper electrode 62 may be regarded as an MR element according to the example embodiment. The stacked film includes a plurality of magnetic films.

Each of the plurality of upper coil elements 72 extends in a direction parallel to the Y direction. The plurality of upper coil elements 72 are arranged in the X direction. In particular, in the present example embodiment, when seen in the Z direction, each of the plurality of first MR elements 50A overlaps two upper coil elements 72.

Each of the plurality of lower coil elements 71 extends in a direction parallel to the Y direction. The plurality of lower coil elements 71 are arranged in the X direction. The shape and arrangement of the plurality of lower coil elements 71 may be the same as or different from those of the plurality of upper coil elements 72.

In the example shown in FIGS. 7 and 8, the plurality of lower coil elements 71 and the plurality of upper coil elements 72 are electrically connected to constitute the first coil 70 that applies a magnetic field in a direction parallel to the X direction to the free layers 54 of the respective first MR elements 50A. The first coil 70 may be configured so that a magnetic field in the X direction can be applied to the free layers 54 in the first and second resistor sections R11 and R12 and a magnetic field in the —X direction can be applied to the free layers 54 in the third and fourth resistor sections R13 and R14. The first coil 70 may be controlled by the processor 40.

Next, a structure of the second chip 3 will be described with reference to FIGS. 9 and 10. FIG. 10 shows a part of a cross section at the position indicated by the line 10-10 in FIG. 9.

The second chip 3 includes a substrate 301 having a top surface 301a, insulating layers 302, 303, 304, 305, 307, 308, 309, and 310, a plurality of lower electrodes 61B, a plurality of lower electrodes 61C, a plurality of upper electrodes 62B, a plurality of upper electrodes 62C, a plurality of lower coil elements 81, and a plurality of upper coil elements 82. The top surface 301a of the substrate 301 is parallel to the XY plane. The Z direction is a direction perpendicular to the top surface 301a of the substrate 301.

The insulating layer 302 is disposed on the substrate 301. The plurality of lower coil elements 81 are disposed on the insulating layer 302. The insulating layer 303 is disposed around the plurality of lower coil elements 81 on the insulating layer 302. The insulating layers 304 and 305 are stacked in this order on the plurality of lower coil elements 81 and the insulating layer 303.

The plurality of lower electrodes 61B and the plurality of lower electrodes 61C are disposed on the insulating layer 305. The insulating layer 307 is disposed around the plurality of lower electrodes 61B and around the plurality of lower electrodes 61C on the insulating layer 305. The plurality of second MR elements 50B are disposed on the plurality of lower electrodes 61B. The plurality of third MR elements 50C are disposed on the plurality of lower electrodes 61C. The insulating layer 308 is disposed around the plurality of second MR elements 50B and around the plurality of third MR elements 50C on the plurality of lower electrodes 61B, the plurality of lower electrodes 61C, and the insulating layer 307. The plurality of upper electrodes 62B are disposed on the plurality of second MR elements 50B and the insulating layer 308. The plurality of upper electrodes 62C are disposed on the plurality of third MR elements 50C and the insulating layer 308. The insulating layer 309 is disposed around the plurality of upper electrodes 62B and around the plurality of upper electrodes 62C on the insulating layer 308.

The insulating layer 310 is disposed on the plurality of upper electrodes 62B, the plurality of upper electrodes 62C, and the insulating layer 309. The plurality of upper coil elements 82 are disposed on the insulating layer 310. The second chip 3 may further include a not-shown insulating layer that covers the plurality of upper coil elements 82 and the insulating layer 310.

The second chip 3 includes a support member that supports the plurality of second MR elements 50B and the plurality of third MR elements 50C. The support member has at least one inclined surface inclined relative to the top surface 301a of the substrate 301. In particular, in the present example embodiment, the support member includes the insulating layer 305. FIG. 9 shows the insulating layer 305, a plurality of second MR elements 50B, a plurality of third MR elements 50C, and a plurality of upper coil elements 82 among the components of the second chip 3.

The insulating layer 305 includes a plurality of protruding surfaces 305c each protruding in a direction away from the top surface 301a of the substrate 301 (Z direction). The plurality of protruding surfaces 305c each extend in the direction parallel to the U direction. Each protruding surface 305c has a triangular roof overall shape formed by moving the triangular shape of the protruding surface 305c shown in FIG. 10 along the direction parallel to the U direction. The plurality of protruding surfaces 305c are arranged in the direction parallel to the V direction.

The plurality of protruding surfaces 305c each have an upper end portion farthest from the top surface 301a of the substrate 301. In the example embodiment, the upper end portions of the respective protruding surface 305c extend in the direction parallel to the U direction. Now, focus is placed on one of the protruding surfaces 305c. The protruding surface 305c includes a first inclined surface 305a and a second inclined surface 305b. The first inclined surface 305a refers to the part of the protruding surface 305c on the V direction side with respect to the upper end portion of the protruding surface 305c. The second inclined surface 305b refers to the part of the protruding surface 305c on the —V direction side with respect to the upper end portion of the protruding surface 305c. The upper end portion of the protruding surface 305c may be the border between the first and second inclined surfaces 305a and 305b.

The top surface 301a of the substrate 301 is parallel to the XY plane. The first and second inclined surfaces 305a and 305b are each inclined relative to the top surface 301a of the substrate 301, i.e., the XY plane. In a cross section perpendicular to the top surface 301a of the substrate 301, the distance between the first and second inclined surfaces 305a and 305b decreases with increasing distance from the top surface 301a of the substrate 301.

In the example embodiment, there are a plurality of protruding surfaces 305c, and thus there are a plurality of first inclined surfaces 305a and a plurality of second inclined surfaces 305b. The insulating layer 305 includes the plurality of first inclined surfaces 305a and the plurality of second inclined surfaces 305b.

The insulating layer 305 includes a plurality of protrusions each protruding in the Z direction. The plurality of protrusions each extend in the direction parallel to the U direction. The protruding surfaces 305c are formed by the top surface of the insulating layer 305. The plurality of protrusions are arranged in the direction parallel to the V direction.

The plurality of lower electrodes 61B are disposed on the plurality of first inclined surfaces 305a. The plurality of lower electrodes 61C are disposed on the plurality of second inclined surfaces 305b. As described above, the first and second inclined surfaces 305a and 305b are each inclined relative to the top surface 301a of the substrate 301, i.e., the XY plane. The top surface of each of the plurality of lower electrodes 61B and the top surface of each of the plurality of lower electrodes 61C are thus also inclined relative to the XY plane. Thus, it can be said that the plurality of second MR elements 50B and the plurality of third MR elements 50C are disposed on inclined surfaces inclined relative to the XY plane. The insulating layer 305 is a member for supporting each of the plurality of second MR elements 50B and the plurality of third MR elements 50C to incline relative to the XY plane.

In the example embodiment, each of the plurality of first inclined surfaces 305a is a flat surface parallel to the U direction and the W1 direction. Each of the plurality of second inclined surfaces 305b is a flat surface parallel to the U direction and the W2 direction.

Although not shown in the drawings, the insulating layer 305 further has a flat surface around the plurality of protruding surfaces 305c. The plurality of protruding surfaces 305c may protrude in the Z direction from the flat surface. The plurality of protruding surfaces 305c may be located at predetermined distances so that a flat surface is formed between two adjoining protruding surfaces 305c. Alternatively, the insulating layer 305 may have grooves recessed in the -Z direction from the flat surface. In such a case, the plurality of protruding surfaces 305c may be located inside the grooves.

Each protruding surface 305c may be a semicylindrical curved surface formed by moving a curved shape (arch shape) along the direction parallel to the U direction. In such a case, the first inclined surfaces 305a are curved surfaces. The second MR elements 50B are curved along the curved surfaces (first inclined surfaces 305a). Even in such a case, for the sake of convenience, the magnetization directions of the magnetization pinned layers 52 in the second MR elements 50B are defined to be straight directions as described above. Similarly, the second inclined surfaces 305b are curved surfaces. The third MR elements 50C are curved along the curved surfaces (second inclined surfaces 305b). Even in such a case, for the sake of convenience, the magnetization directions of the magnetization pinned layers 52 in the third MR elements 50C are defined to be straight directions as described above.

As shown in FIG. 9, the plurality of second MR elements 50B are disposed so that two or more MR elements 50B are arranged both in the U direction and in the V direction. A plurality of second MR elements 50B are arranged in a row on one first inclined surface 305a. Similarly, the plurality of third MR elements 50C are disposed so that two or more MR elements 50C are arranged both in the U direction and in the V direction. A plurality of third MR elements 50C are arranged in a row on one second inclined surface 305b. In the example embodiment, a plurality of rows of second MR elements 50B and a plurality of rows of third MR elements 50C are alternately arranged in the direction parallel to the V direction.

When seen in the Z direction, a second MR element 50B and a third MR element 50C adjoining each other may be at different positions or the same position in the direction parallel to the U direction. When seen in the Z direction, two second MR elements 50B adjoining with a third MR element 50C therebetween may be at different positions or the same position in the direction parallel to the U direction. When seen in the Z direction, two third MR elements 50C adjoining with a second MR element 50B therebetween may be at different positions or the same position in the direction parallel to the U direction.

The plurality of second MR elements 50B are connected in series by the plurality of lower electrodes 61B and the plurality of upper electrodes 62B. The foregoing description of the method for connecting the plurality of first MR elements 50A also applies to a method for connecting the plurality of second MR elements 50B. If the MR elements 50 shown in FIG. 11 are second MR elements 50B, the lower electrodes 61 shown in FIG. 11 correspond to lower electrodes 61B, and the upper electrode 62 shown in FIG. 11 correspond to upper electrodes 62B. In such a case, the longitudinal direction of the lower electrodes 61 is parallel to the U direction.

Similarly, the plurality of third MR elements 50C are connected in series by the plurality of lower electrodes 61C and the plurality of upper electrodes 62C. The foregoing description of the method for connecting the plurality of first MR elements 50A also applies to a method for connecting the plurality of third MR elements 50C. If the MR elements 50 shown in FIG. 11 are third MR elements 50C, the lower electrodes 61 shown in FIG. 11 correspond to lower electrodes 61C, and the upper electrodes 62 shown in FIG. 11 correspond to upper electrodes 62C. In such a case, the longitudinal direction of the lower electrodes 61 is parallel to the U direction.

Each of the plurality of upper coil elements 82 extends in a direction parallel to the Y direction. The plurality of upper coil elements 82 are arranged in the X direction. In particular, in the present example embodiment, when seen in the Z direction, each of the plurality of second MR elements 50B and the plurality of third MR elements 50C overlaps two upper coil elements 82.

Each of the plurality of lower coil elements 81 extends in a direction parallel to the Y direction. The plurality of lower coil elements 81 are arranged in the X direction. The shape and arrangement of the plurality of lower coil elements 81 may be the same as or different from those of the plurality of upper coil elements 82.

In the example shown in FIGS. 9 and 10, the plurality of lower coil elements 81 and the plurality of upper coil elements 82 are electrically connected to constitute the second coil 80 that applies a magnetic field in the direction parallel to the X direction to the free layer 54 in each of the plurality of second MR elements 50B and the plurality of third MR elements 50C. The second coil 80 may be configured, for example, so that a magnetic field in the X direction can be applied to the free layers 54 in the first and second resistor sections R21 and R22 of the second detection circuit 20 and the first and second resistor sections R31 and R32 of the third detection circuit 30, and a magnetic field in the —X direction can be applied to the free layers 54 in the third and fourth resistor sections R23 and R24 of the second detection circuit 20 and the third and fourth resistor sections R33 and R34 of the third detection circuit 30. The second coil 80 may be controlled by the processor 40.

Next, the first to third detection signals will be described. The first detection signal will initially be described with reference to FIG. 4. As the strength of the component of the target magnetic field in the direction parallel to the U direction changes, the resistance of each of the resistor sections R11 to R14 of the first detection circuit 10 changes either so that the resistances of the resistor sections R11 and R13 increase and the resistances of the resistor sections R12 and R14 decrease or so that the resistances of the resistor sections R11 and R13 decrease and the resistances of the resistor sections R12 and R14 increase. Thereby the electric potential of each of the signal output ports E11 and E12 changes. The first detection circuit 10 generates a signal corresponding to the electric potential of the signal output port E11 as a first detection signal S11, and generates a signal corresponding to the electric potential of the signal output port E12 as a first detection signal S12.

Next, the second detection signal will be described with reference to FIG. 5. As the strength of the component of the target magnetic field in the direction parallel to the W1 direction changes, the resistance of each of the resistor sections R21 to R24 of the second detection circuit 20 changes either so that the resistances of the resistor sections R21 and R23 increase and the resistances of the resistor sections R22 and R24 decrease or so that the resistances of the resistor sections R21 and R23 decrease and the resistances of the resistor sections R22 and R24 increase. Thereby the electric potential of each of the signal output ports E21 and E22 changes. The second detection circuit 20 generates a signal corresponding to the electric potential of the signal output port E21 as a second detection signal S21, and generates a signal corresponding to the electric potential of the signal output port E22 as a second detection signal S22.

Next, the third detection signal will be described with reference to FIG. 6. As the strength of the component of the target magnetic field in the direction parallel to the W2 direction changes, the resistance of each of the resistor sections R31 to R34 of the third detection circuit 30 changes either so that the resistances of the resistor sections R31 and R33 increase and the resistances of the resistor sections R32 and R34 decrease or so that the resistances of the resistor sections R31 and R33 decrease and the resistances of the resistor sections R32 and R34 increase. Thereby the electric potential of each of the signal output ports E31 and E32 changes. The third detection circuit 30 generates a signal corresponding to the electric potential of the signal output port E31 as a third detection signal S31, and generates a signal corresponding to the electric potential of the signal output port E32 as a third detection signal S32.

Next, a configuration and operation of the processor 40 will be described. The processor 40 is configured to generate a first detection value based on the first detection signals S11 and S12, and generate a second detection value and a third detection value based on the second detection signals S21 and S22 and the third detection signals S31 and S32. The first detection value is a detection value corresponding to the component of the target magnetic field in the direction parallel to the U direction. The second detection value is a detection value corresponding to the component of the target magnetic field in the direction parallel to the V direction. The third detection value is a detection value corresponding to the component of the target magnetic field in the direction parallel to the Z direction. The first detection value will hereinafter be represented by the symbol Su, the second detection value by the symbol Sv, and the third detection value by the symbol Sz.

Figure 12:
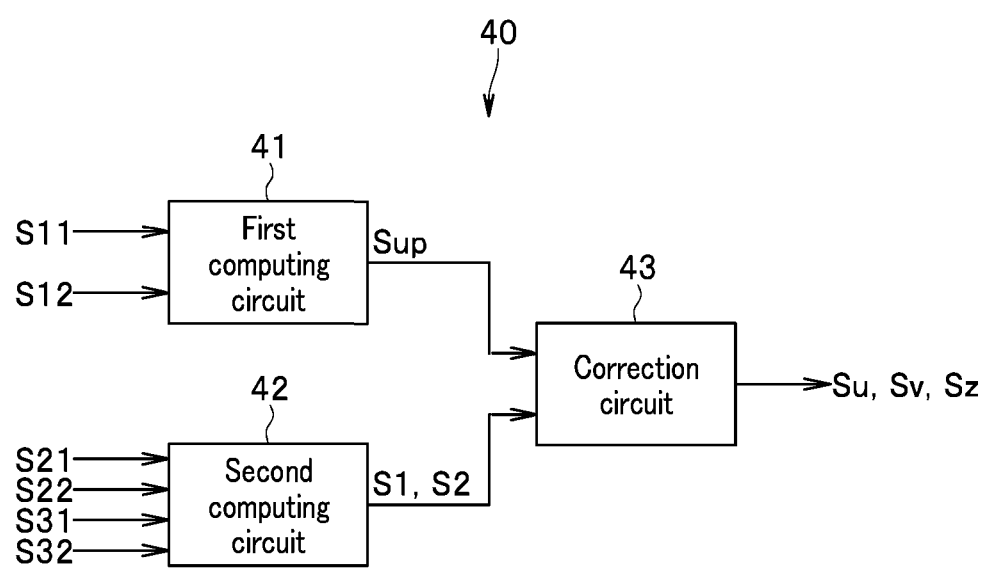
FIG. 12 is a functional block diagram showing a configuration of a processor of the first example embodiment of the technology.

FIG. 12 is a functional block diagram showing a configuration of the processor 40. The processor 40 includes a first computing circuit 41, a second computing circuit 42, and a correction circuit 43. The first computing circuit 41 is configured to execute first generation processing. The first generation processing is processing for generating a first initial detection value Sup corresponding to a first detection value Su using the first detection signals S11 and S12.

In the present example embodiment, the first computing circuit 41 generates a first initial detection value Sup by computing including determination of a difference S11-S12 between the first detection signal S11 and the first detection signal S12. The first initial detection value Sup may be the difference S11-S12 itself. The first initial detection value Sup may be a result of predetermined corrections, such as gain adjustment and offset adjustment, made on the difference S11-S12.

The second computing circuit 42 is configured to execute at least a part of second generation processing. The second generation processing includes processing for generating a second initial detection value Svp corresponding to a second detection value Sv and processing for generating a third initial detection value Szp corresponding to a third detection value Sz. The processing for generating the second initial detection value Svp uses at least the second detection signals S21 and S22. In the example embodiment, both the processing for generating the second initial detection value Svp and the processing for generating the third initial detection value Szp use the second detection signals S21 and S22 and the third detection signals S31 and S32.

In the example embodiment, the second generation processing includes first processing, second processing, and third processing. The first processing is processing for generating a first value S1 using the second detection signals S21 and S22. The second processing is processing for generating a second value S2 using the third detection signals S31 and S32. The third processing is processing for generating the second initial detection value Svp and the third initial detection value Szp using the first value S1 and the second value S2.

In particular, in the example embodiment, the second computing circuit 42 is configured to execute the first processing and the second processing. The first processing is processing for generating the first value S1 by computing including determination of a difference S21-S22 between the second detection signal S21 and the second detection signal S22. The second processing is processing for generating the second value S2 by computing including determination of a difference S31-S32 between the third detection signal S31 and the third detection signal S32.

The third processing includes processing for calculating values S3 and S4 by using the following Eqs. (1) and (2):

$$S3=(S2+S1)/(2\cos\alpha) \quad (1)$$

$$S4=(S2-S1)/(2\sin\alpha) \quad (2)$$

The third processing further includes processing for generating the second and third initial detection values Svp and Szp using the values S3 and S4. The second initial detection value Svp generated by the third processing may be the value S3 itself. The second initial detection value Svp may be a result of predetermined corrections, such as gain adjustment and offset adjustment, made to the value S3. Similarly, the third initial detection value Szp generated by the third processing may be the value S4 itself. The third initial detection value Szp may be a result of predetermined corrections, such as gain adjustment and offset adjustment, made to the value S4.

The correction circuit 43 generates the first to third detection values Su, Sv, and Sz using the first to third initial detection values Sup, Svp, and Szp. In particular, in the example embodiment, the correction circuit 43 is configured to execute the third processing of the second generation processing, first correction processing, second correction processing, and determination processing to generate the first to third detection values Su, Sv, and Sz.

In the first correction processing, the first initial detection value Sup is updated once or more. The first initial detection value Sup last updated will hereinafter be referred to as the latest first initial detection value Sup. For the sake of convenience, the first initial detection value Sup after the execution of the first generation processing and before the execution of the first correction processing for the first time will also be referred to as the latest first initial detection value Sup.

In the second correction processing, the second initial detection value Svp and the third initial detection value Szp are each updated once or more. The second initial detection value Svp last updated will hereinafter be referred to as the latest second initial detection value Svp, and the third initial detection value Szp last updated as the latest third initial detection value Szp.

The first correction processing is processing for correcting the first initial detection value Sup (latest first initial detection value Sup) using a second correction value Svc generated from the latest second initial detection value Svp, and updating the first initial detection value Sup.

The second correction value Svc may be a value calculated by computing including multiplication of the latest second initial detection value Svp by a second correction coefficient. The second correction value Svc last calculated will hereinafter be referred to the latest second correction value Svc. The first correction processing may be processing for calculating (updating) the first initial detection value Sup by substituting the latest first initial detection value Sup and the latest second correction value Svc into an equation expressed using the first initial detection value Sup and the second correction value Svc. This equation may include first computing including multiplication of the latest first initial detection value Sup by the second correction value Svc, and second computing for adding the value obtained by the first computing to the latest first initial detection value Sup or for subtracting the value from the latest first initial detection value Sup.

The second correction processing is processing for correcting the second initial detection value Svp (latest second initial detection value Svp) and the third initial detection value Szp (latest third initial detection value Szp) using a first correction value Suc generated from the latest first initial detection value Sup, and updating the second and third initial detection values Svp and Szp. In particular, in the example embodiment, the second correction processing includes fourth processing, fifth processing, and sixth processing. The fourth processing is processing for correcting the first and second values S1 and S2 using the first correction value Suc, and updating the first and second values S1 and S2. The fifth processing is processing for generating the second and third initial detection values Svp and Szp using the latest first and second values S1 and S2. The sixth processing is processing for updating the second and third initial detection values Svp and Szp using the second and third initial detection values Svp and Szp generated by the fifth processing. The latest first value S1 refers to the first value S1 last updated. The latest second value S2 refers to the second value S2 last updated. For the sake of convenience, the first value S1 and the second value S2 after the execution of the first and second processing and before the execution of the third processing for the first time will also be referred to as the latest first value S1 and the latest second value S2, respectively.

The content of the fifth processing is substantially the same as that of the third processing of the second generation processing. In other words, the second correction processing substantially includes the third processing of the second generation processing. The fifth processing includes processing for calculating the values S3 and S4 using the latest first and second values S1 and S2 and Eqs. (1) and (2), and processing for generating the second and third initial detection values Svp and Szp using the values S3 and S4.

The first correction value Suc may be a value calculated by computing including multiplication of the latest first initial detection value Sup by a first correction coefficient. The first correction value Suc last calculated will hereinafter be referred to as the latest first correction value Suc. The fourth processing of the second correction processing may be processing for calculating (updating) the first value S1 by substituting the latest first value S1 and the latest first correction value Suc into a first equation expressed using the first value S1 and the first correction value Suc, and calculating (updating) the second value S2 by substituting the latest second value S2 and the latest first correction value Suc into a second equation expressed using the second value S2 and the first correction value Suc. The first equation may include third computing including multiplication of the latest first value S1 by the first correction value Suc, and fourth computing for adding the value obtained by the third computing to the latest first value S1 or for subtracting the value from the latest first value S1. The second equation may include fifth computing including multiplication of the latest second value S2 by the first correction value Suc, and sixth computing for adding the value obtained by the fifth computing to the latest second value S2 or for subtracting the value from the latest second value S2.

The determination processing is processing for determining the latest first initial detection value Sup as the first detection value Su, determining the latest second initial detection value Svp as the second detection value Sv, and determining the latest third initial detection value Szp as the third detection value Sz. The correction circuit 43 executes the determination processing after alternately executing the first correction processing and the second correction processing once or more. The correction circuit 43 may execute the first correction processing and the second correction processing once each, twice each, or three or more times each.

The correction circuit 43 may update the second and third initial detection values Svp and Szp first. In other words, the correction circuit 43 may execute the second correction processing for the first time before executing the first correction processing for the first time.

The second correction processing is executed for the first time after the first processing and second processing of the second generation processing are executed. As described above, the second correction processing substantially includes the third processing of the second generation processing. The second generation processing is thus substantially executed by executing the second correction processing for the first time.

The configuration of the processor 40 is not limited to the example shown in FIG. 12. For example, the first computing circuit 41, the second computing circuit 42, and the correction circuit 43 may be substantially a single circuit. In such a case, the single circuit may be configured to be capable of executing all the processing to be executed by the first computing circuit 41, the second computing circuit 42, and the correction circuit 43. Alternatively, instead of providing the correction circuit 43, the first computing circuit 41 may be configured to execute a part of the processing to be executed by the correction circuit 43 (processing related to the first initial detection value Sup and the first detection value Su), and the second computing circuit 42 to execute another part of the processing to be executed by the correction circuit 43 (processing related to the second and third initial detection values Svp and Szp and the second and third detection values Sv and Sz). In such a case, the first computing circuit 41 and the second computing circuit 42 may be configured to be capable of transmitting and receiving the first and second initial detection values Sup and Svp therebetween.

Next, effects of the series of processing executed by the correction circuit 43 will be described. Initially, first to third detection circuits of a comparative example will be described. The first detection circuit of the comparative example has a configuration identical to that of the first detection circuit 10 shown in FIG. 4 except for the magnetization direction of the free layer 54 in each of the plurality of first MR elements 50A in the case where no target magnetic field is applied to the plurality of first MR elements 50A. In the first detection circuit of the comparative example, the magnetization directions of the free layers 54 in the foregoing case are the V direction in all the plurality of first MR elements 50A.

The second detection circuit of the comparative example has a configuration identical to that of the second detection circuit 20 shown in FIG. 5 except for the magnetization direction of the free layer 54 in each of the plurality of second MR elements 50B in the case where no target magnetic field is applied to the plurality of second MR elements 50B. In the second detection circuit of the comparative example, the magnetization directions of the free layers 54 in the foregoing case are the U direction in all the plurality of second MR elements 50B.

The third detection circuit of the comparative example has a configuration identical to that of the third detection circuit 30 shown in FIG. 6 except for the magnetization direction of the free layer 54 in each of the plurality of third MR elements 50C in the case where no target magnetic field is applied to the plurality of third MR elements 50C. In the third detection circuit of the comparative example, the magnetization directions of the free layers 54 in the foregoing case are the U direction in all the plurality of third MR elements 50C.

In the first detection circuit of the comparative example, a magnetic field in the direction parallel to the V direction (component of the target magnetic field in the direction parallel to the V direction) substantially acts to change an anisotropic magnetic field which is based on the shape anisotropy that sets the direction of the magnetization easy axis to the direction parallel to the V direction. The anisotropic magnetic field acts on the magnetization of the free layers 54. In the first detection circuit of the comparative example, the magnetization directions of the free layers 54 in detecting the component of the target magnetic field in the direction parallel to the U direction thus change depending on the presence or absence of a magnetic field in the direction parallel to the V direction and a change in the strength of the magnetic field. This causes the first detection signals S11 and S12 to deviate from those in detecting the component of the target magnetic field in the direction parallel to the U direction in the absence of the magnetic field in the direction parallel to the V direction. As a result, the difference S11-S12 substantially equivalent to the first detection value Su also deviates.

By contrast, in the example embodiment, the magnetization directions of the free layers 54 vary from one resistor section to another. In particular, in the example embodiment, the magnetization directions of the free layers 54 are set so that deviations of the first detection signals S11 and S12 due to a magnetic field in the direction parallel to the V direction can be cancelled out in calculating the difference S11-S12. According to the example embodiment, the deviations of the difference S11-S12 due to the magnetic field in the direction parallel to the V direction can thereby be reduced. As a result, according to the example embodiment, an error in the first detection value Su due to the magnetic field in the direction parallel to the V direction can be reduced.

The foregoing description of the first detection circuit of the comparative example also applies to the second and third detection circuits of the comparative example. In the second detection circuit of the comparative example, the second detection signals S21 and S22 deviate from those when the component of the target magnetic field in the direction parallel to the W1 direction is detected in the absence of the magnetic field in the direction parallel to the U direction. As a result, the first value S1 also deviates. In the third detection circuit of the comparative example, the third detection signals S31 and S32 deviate from those when the component of the target magnetic field in the direction parallel to the W2 direction is detected in the absence of the magnetic field in the direction parallel to the U direction. As a result, the second value S2 also deviates. For such reasons, the value S3 substantially equivalent to the second detection value Sv and the value S4 substantially equivalent to the third detection value Sz also deviate. By contrast, according to the example embodiment, the deviations in the values S3 and S4 due to the magnetic field in the direction parallel to the U direction can be reduced. As a result, according to the example embodiment, errors in the second and third detection values Sv and Sz due to the magnetic field in the direction parallel to the U direction can be reduced.

The series of processing executed by the correction circuit 43 is processing for further reducing the deviation in the difference S11-S12 reduced as described above, i.e., the deviation in the first initial detection value Sup, the deviation in the value S3, i.e., the deviation in the second initial detection value Svp, and the deviation in the value S4, i.e., the deviation in the third initial detection value Szp. The first correction processing corrects the first initial detection value Sup using the second initial detection value Svp having a correspondence with the strength of the component of the target magnetic field in the direction parallel to the V direction. By using the second initial detection value Svp, the first initial detection value Sup can be corrected based on the presence or absence of the magnetic field in the direction parallel to the V direction and a change in the strength of the magnetic field. Specifically, since the second correction value Svc varies depending on the presence or absence of the magnetic field in the direction parallel to the V direction and a change in the strength of the magnetic field, the first initial detection value Sup can be corrected with high precision.

The second correction coefficient and the foregoing equation expressed using the first initial detection value Sup and the second correction value Svc may be defined so that the amount of correction to the first initial detection value Sup increases with increasing the magnitude of the deviation in the first initial detection value Sup, and the sign of the amount of correction to the first initial detection value Sup varies depending on whether the first initial detection value Sup deviates to decrease or deviates to increase. For example, if the first initial detection value Sup deviates to decrease, the amount of correction to the first initial detection value Sup corresponding to the amount of decrease of the first initial detection value Sup may be added to the first initial detection value Sup. If the first initial detection value Sup deviates to increase, the amount of correction to the first initial detection value Sup corresponding to the amount of increase of the first initial detection value Sup may be subtracted from the first initial detection value Sup.

The foregoing description of the first correction processing applies to the second correction processing as well. More specifically, the second correction processing corrects the first and second values S1 and S2 using the first initial detection value Sup having a correspondence with the strength of the component of the target magnetic field in the direction parallel to the U direction. The second and third initial detection values Svp and Szp are thereby substantially corrected using the first initial detection value Sup having a correspondence with the strength of the component of the target magnetic field in the direction parallel to the U direction. By using the first initial detection value Sup, the first and second values S1 and S2 (second and third initial detection values Svp and Szp) can be corrected based on the presence or absence of the magnetic field in the direction parallel to the U direction and a change in the strength of the magnetic field. Specifically, since the first correction value Suc varies depending on the presence or absence of the magnetic field in the direction parallel to the U direction and a change in the strength of the magnetic field, the first and second values S1 and S2 (second and third initial detection values Svp and Szp) can be corrected with high precision.

The first correction coefficient and the foregoing first and second equations may be defined so that the amount of correction to the second initial detection value Svp increases with increasing the magnitude of the deviation in the second initial detection value Svp, and the sign of the amount of correction to the second initial detection value Svp varies depending on whether the second initial detection value Svp deviates to decrease or deviates to increase.

The first correction coefficient and the second correction coefficient may be selected in advance so that the deviation in the first initial detection value Sup, the deviation in the second initial detection value Svp, and the deviation in the third initial detection value Szp are reduced. The first correction coefficient and the second correction coefficient may be determined by a numerical analysis or the like, based on a plurality of measurement results.

To apply the first and second correction processing to the first to third initial detection values Sup, Svp, and Szp generated by the first to third detection circuits of the comparative example, the content of the first and second correction processing needs to be changed. For example, the signs of the first and second correction coefficients need to be changed depending on the direction of the magnetic field applied. By contrast, in the example embodiment, the same first and second correction processing can be applied regardless of the direction of the magnetic field applied. This can simplify the configuration of the correction circuit 43 and the contents of the first and second correction processing.

By the way, as a means for reducing deviations in the first to third initial detection values Sup, Svp, and Szp, each of the first to third detection circuits 10, 20, and 30 can include a shield formed of a magnetic material to prevent application of magnetic fields other than the magnetic field to be detected. For example, the first detection circuit 10 can include a shield configured to hardly attenuate the magnetic field in the direction parallel to the U direction but cut off or attenuate the magnetic field in the direction parallel to the V direction. Similarly, the second and third detection circuits 20 and 30 can include a shield configured to hardly attenuate the magnetic field in the direction parallel to the W1 direction and the magnetic field in the direction parallel to the W2 direction but cut off or attenuate the magnetic field in the direction parallel to the U direction. However, in the example embodiment, the deviations in the first to third initial detection values Sup, Svp, and Szp are reduced without providing the shields for the respective first to third detection circuits 10, 20, and 30. According to the example embodiment, the structure of the magnetic sensor 1 can thus be simplified.

In the example embodiment, the first initial detection value Sup is generated using the first detection signals S11 and S12 generated by detecting the component of the target magnetic field in a direction parallel to the reference plane 4a, i.e., the XY plane (the component of the target magnetic field in the direction parallel to the U direction). The second and third initial detection values Svp and Szp are generated using the second detection signals S21 and S22 and the third detection signals S31 and S32 generated by detecting the component of the target magnetic field in a direction inclined relative to the reference plane 4a, i.e., the XY plane (the component of the target magnetic field in the direction parallel to the W1 direction) and the component of the target magnetic field in another direction inclined relative to the reference plane 4a, i.e., the XY plane (the component of the target magnetic field in the direction parallel to the W2 direction). The example embodiment is thus characterized in that the deviation in each of the first to third initial detection values Sup, Svp, and Szp generated by detecting the component of the target magnetic field in the direction parallel to the XY plane and the components of the target magnetic field in the directions inclined relative to the XY plane is reduced.

As described above, in the example embodiment, the detection value corresponding to the component of the target magnetic field in the direction parallel to the U direction (first initial detection value Sup) is generated by detecting the component of the target magnetic field in the direction parallel to the U direction. However, the detection value corresponding to the component of the target magnetic field in the direction parallel to the V direction (second initial detection value Svp) is not generated by detecting the component of the target magnetic field in the direction parallel to the V direction. The detection value corresponding to the component of the target magnetic field in the direction parallel to the Z direction (third initial detection value Szp) is not generated by detecting the component of the target magnetic field in the direction parallel to the Z direction, either. In the example embodiment, the first initial detection value Sup therefore can sometimes be generated more accurately than the second and third initial detection values Svp and Szp. In such a case, the first to third initial detection values Sup, Svp, and Szp can be updated with high precision by executing the second correction processing using the first initial detection value Sup before the first correction processing.

In the example embodiment, the first detection circuit 10 for generating the first detection signals S11 and S12 is included in the first chip 2. The second detection circuit 20 for generating the second detection signals S21 and S22 and the third detection circuit 30 for generating the third detection signals S31 and S32 are included in the second chip 3. The example embodiment is thus characterized in that the deviation in each of the first to third initial detection values Sup, Svp, and Szp generated using the detection circuits included in the two physically separated chips is reduced.

Next, a result of a simulation examining the error in the second detection value Sv will be described. In the simulation, the first to third detection values Su, Sv, and Sz were generated by applying a target magnetic field including at least a component in the U direction and a component in the V direction to the magnetic sensor device 100. In the simulation, the first to third initial detection values Sup, Svp, and Szp were generated by correcting the difference S11-S12 and the values S3 and S4 so that the first to third detection values Su, Sv, and Sz indicated the strength of the component of the target magnetic field in the direction parallel to the U direction, the strength of the component of the target magnetic field in the direction parallel to the V direction, and the strength of the component of the target magnetic field in the direction parallel to the Z direction, respectively. In the simulation, the second correction processing was executed for the first time before the first correction processing was executed for the first time.

In the simulation, the determination processing was executed to generate the first to third detection values Su, Sv, and Sz each time the second correction processing and the first correction processing were alternately executed. Moreover, a difference between the strength of the component of the target magnetic field in the V direction and the second detection value Sv, divided by the strength of the component of the target magnetic field in the V direction was determined as the error in the second detection value Sv.

In the simulation, the third processing of the second generation processing was executed to determine the second initial detection value Svp before the first and second correction processing was executed. From this second initial detection value Svp, the error in the second detection value Sv for the case where the number of times of execution of each of the first correction processing and the second correction processing was zero was determined. More specifically, a difference between the strength of the component of the target magnetic field in the V direction and the second initial detection value Svp, divided by the strength of the component of the target magnetic field in the V direction was determined as the error in the second detection value Sv for the case where the number of times of execution of each of the first correction processing and the second correction processing was zero. The error in the second detection value Sv for the case where the number of times of execution of each of the first correction processing and the second correction processing was zero was 3.54%.

The error in the second detection value Sv for the case where the number of times of execution of each of the first correction processing and the second correction processing was one was 0.13%. The errors in the second detection value Sv for the cases where the number of times of execution of each of the first correction processing and the second correction processing was two and three were both 0%.

As can be seen from the result of the simulation, the error in the second detection value Sv can be reduced by executing the first correction processing and the second correction processing once each. The error in the second detection value Sv can be reduced to almost zero by executing the first correction processing and the second correction processing twice each. The error in the second detection value Sv for the case where the first correction processing and the second correction processing were each executed three times was also almost zero. In terms of load on the processor 40, the number of times of execution of each of the first correction processing and the second correction processing is preferably two.

The foregoing description of the second detection value Sv applies to the first detection value Su and the third detection value Sz as well.

Second Example Embodiment

Next, a magnetic sensor device according to a second example embodiment of the technology will be described. This example embodiment is different from the first example embodiment in the magnetization directions of the free layers 54 in the MR elements 50.

Figure 13:
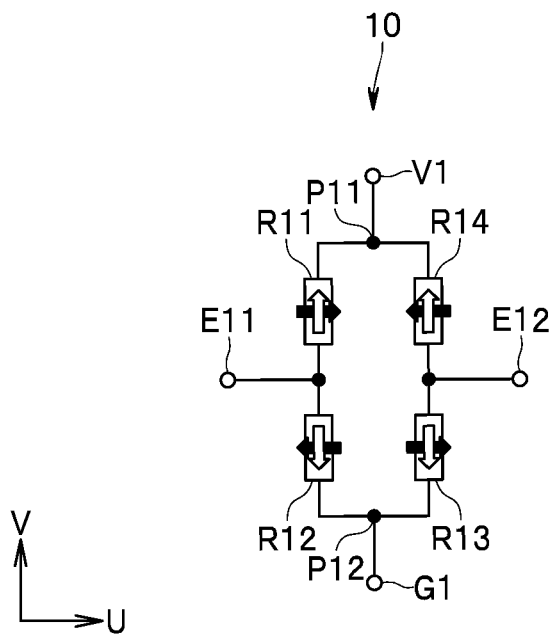
FIG. 13 is a circuit diagram showing a circuit configuration of a first detection circuit of a second example embodiment of the technology.
Figure 14:
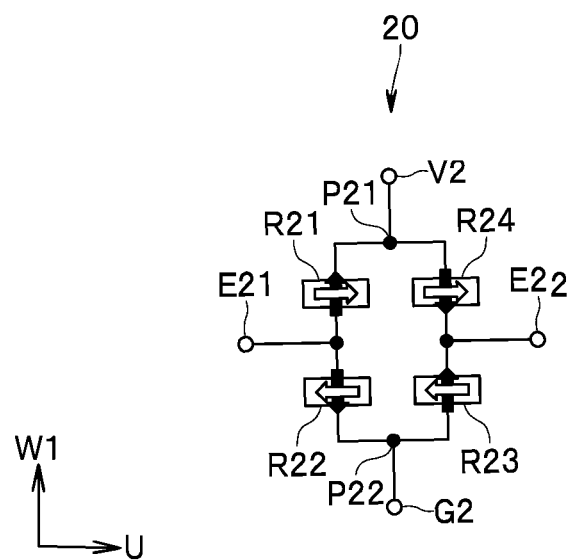
FIG. 14 is a circuit diagram showing a circuit configuration of a second detection circuit of the second example embodiment of the technology.
Figure 15:
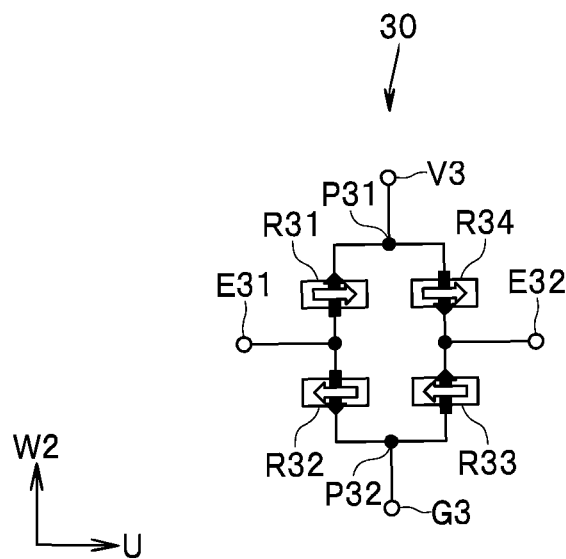
FIG. 15 is a circuit diagram showing a circuit configuration of a third detection circuit of the second example embodiment of the technology.

The magnetization directions of the free layers 54 in the MR elements 50 will be described below by using the first to fourth magnetization directions defined in the first example embodiment. FIG. 13 is a circuit diagram showing a circuit configuration of the first detection circuit 10. FIG. 14 is a circuit diagram showing a circuit configuration of the second detection circuit 20. FIG. 15 is a circuit diagram showing a circuit configuration of the third detection circuit 30.

Like the first example embodiment, in the first detection circuit 10, the first magnetization direction is the U direction, the second magnetization direction the −U direction, the third magnetization direction the V direction, and the fourth magnetization direction the —V direction. In the present example embodiment, the magnetization of the free layer 54 in each of the first and fourth resistor sections R11 and R14 includes a component in the third magnetization direction (V direction) in the case where the target magnetic field is not applied to the plurality of first MR elements 50A. The magnetization of the free layer 54 in each of the second and third resistor sections R12 and R13 includes a component in the fourth magnetization direction (—V direction) in the case where the target magnetic field is not applied to the plurality of first MR elements 50A.

In the example embodiment, the first coil 70 (see FIG. 3) may be configured, for example, so that a magnetic field in the X direction can be applied to the free layers 54 in the first and fourth resistor sections R11 and R14, and a magnetic field in the —X direction can be applied to the free layers 54 in the second and third resistor sections R12 and R13.

Like the first example embodiment, in the second detection circuit 20, the first magnetization direction is the W1 direction, the second magnetization direction the −W1 direction, the third magnetization direction the U direction, and the fourth magnetization direction the −U direction. In the present example embodiment, the magnetization of the free layer 54 in each of the first and fourth resistor sections R21 and R24 includes a component in the third magnetization direction (U direction) in the case where the target magnetic field is not applied to the plurality of second MR elements 50B. The magnetization of the free layer 54 in each of the second and third resistor sections R22 and R23 includes a component in the fourth magnetization direction (−U direction) in the case where the target magnetic field is not applied to the plurality of second MR elements 50B.

Like the first example embodiment, in the third detection circuit 30, the first magnetization direction is the W2 direction, the second magnetization direction the −W2 direction, the third magnetization direction the U direction, and the fourth magnetization direction the −U direction. In the present example embodiment, the magnetization of the free layer 54 in each of the first and fourth resistor sections R31 and R34 includes a component in the third magnetization direction (U direction) in the case where the target magnetic field is not applied to the plurality of third MR elements 50C. The magnetization of the free layer 54 in each of the second and third resistor sections R32 and R33 includes a component in the fourth magnetization direction (−U direction) in the case where the target magnetic field is not applied to the plurality of third MR elements 50C.

In the example embodiment, the second coil 80 (see FIG. 3) may be configured, for example, so that a magnetic field in the X direction can be applied to the free layers 54 in the first and fourth resistor sections R21 and R24 of the second detection circuit 20 and the first and fourth resistor sections R31 and R34 of the third detection circuit 30, and a magnetic field in the —X direction can be applied to the free layers 54 in the second and third resistor sections R22 and R23 of the second detection circuit 20 and the second and third resistor sections R32 and R33 of the third detection circuit 30.

The configuration, operation, and effects of the present example embodiment are otherwise the same as those of the first example embodiment.

Third Example Embodiment

A third example embodiment of the technology will now be described. A magnetic sensor device 100 according to the example embodiment includes a magnetic sensor 101 according to the example embodiment and the processor 40 described in the first example embodiment. The magnetic sensor 101 may have an external shape similar to that of the first chip 2 or the second chip 3 of the first example embodiment.

Figure 16:
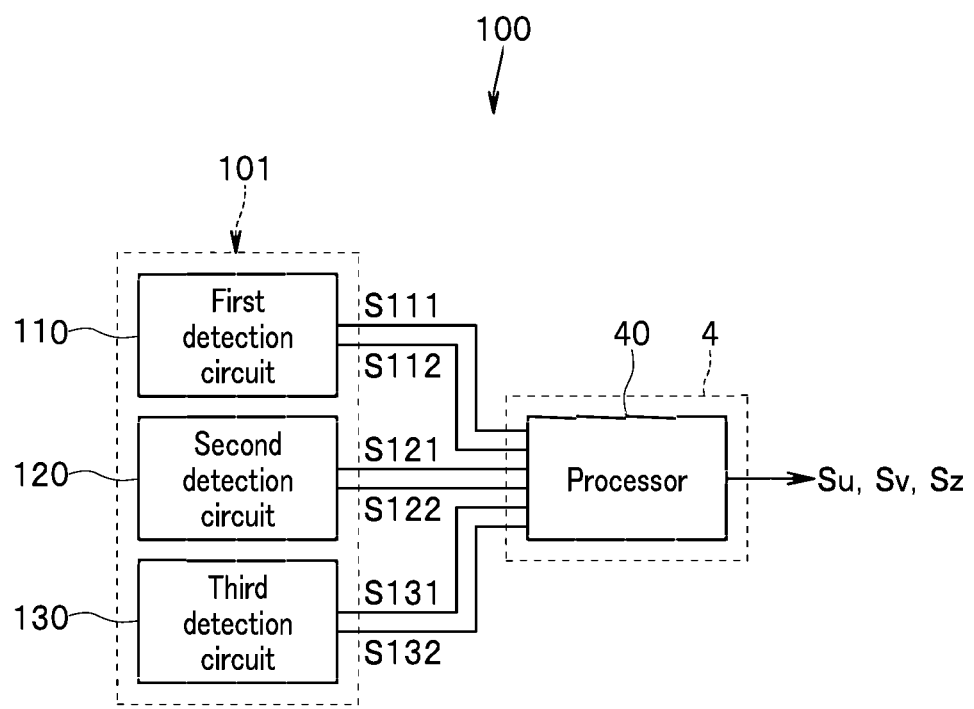
FIG. 16 is a functional block diagram showing a configuration of a magnetic sensor device according to a third example embodiment of the technology.
Figure 17:
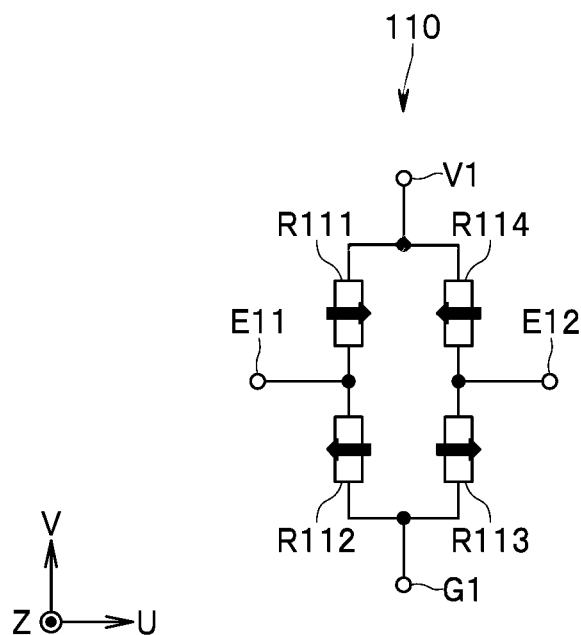
FIG. 17 is a circuit diagram showing a circuit configuration of a first detection circuit of a third example embodiment of the technology.
Figure 18:
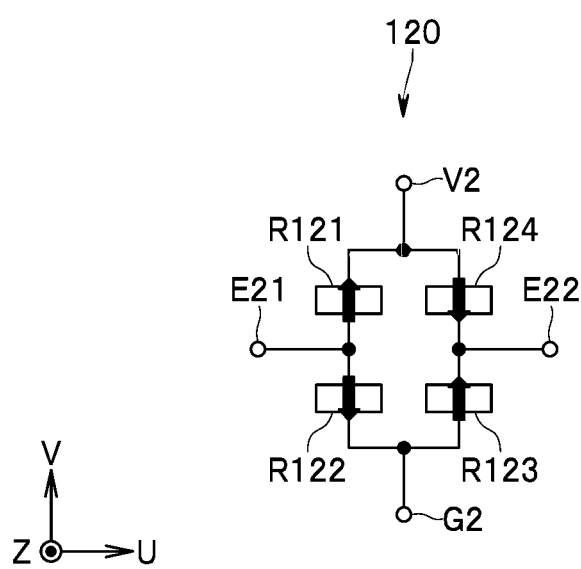
FIG. 18 is a circuit diagram showing a circuit configuration of a second detection circuit of the third example embodiment of the technology.
Figure 19:
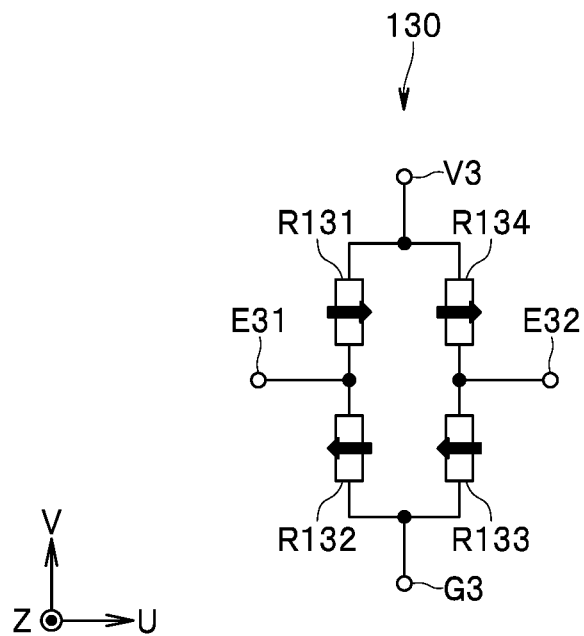
FIG. 19 is a circuit diagram showing a circuit configuration of a third detection circuit of the third example embodiment of the technology.

A configuration of the magnetic sensor 101 according to the example embodiment will be described below with reference to FIGS. 16 to 19. FIG. 16 is a functional block diagram showing a configuration of the magnetic sensor device 100 according to the example embodiment. FIG. 17 is a circuit diagram showing a circuit configuration of a first detection circuit of the example embodiment. FIG. 18 is a circuit diagram showing a circuit configuration of a second detection circuit of the example embodiment. FIG. 19 is a circuit diagram showing a circuit configuration of a third detection circuit of the example embodiment.

The magnetic sensor 101 includes a first detection circuit 110, a second detection circuit 120, and a third detection circuit 130. The first to third detection circuits 110, 120, and 130 each include a plurality of MR elements.

The first detection circuit 110 is configured to detect a component of the target magnetic field in the direction parallel to the U direction and generate first detection signals S111 and S112 having a correspondence with the component. The second detection circuit 120 is configured to detect a component of the target magnetic field in the direction parallel to the V direction and generate second detection signals S121 and S122 having a correspondence with the component. The third detection circuit 130 is configured to detect a component of the target magnetic field in the direction parallel to the Z direction and generate third detection signals S131 and S132 having a correspondence with the component.

The first detection circuit 110 has basically the same circuit configuration as that of the first detection circuit 10 of the first example embodiment. In FIG. 17, the first to fourth resistor sections of the first detection circuit 110 corresponding to the first to fourth resistor sections R11, R12, R13, and R14 of the first detection circuit 10 are denoted by the reference symbols R111, R112, R113, and R114, respectively.

The second detection circuit 120 has basically the same circuit configuration as that of the second detection circuit 20 of the first example embodiment. In FIG. 18, the first to fourth resistor sections of the second detection circuit 120 corresponding to the first to fourth resistor sections R21, R22, R23, and R24 of the second detection circuit 20 are denoted by the reference symbols R121, R122, R123, and R124, respectively.

The third detection circuit 130 has basically the same circuit configuration as that of the third detection circuit 30 of the first example embodiment. In FIG. 19, the first to fourth resistor sections of the third detection circuit 130 corresponding to the first to fourth resistor sections R31, R32, R33, and R34 of the third detection circuit 30 are denoted by the reference symbols R131, R132, R133, and R134, respectively.

The resistor sections R111 to R114, R121 to R124, and R131 to R134 include a plurality of MR elements. The plurality of MR elements of the magnetic sensor 101 will hereinafter be denoted by the reference numeral 150. The MR elements 150 may have the same configuration as that of the MR elements 50 described in the first example embodiment. More specifically, the MR elements 150 each include at least a magnetization pinned layer 52, a free layer 54, and a gap layer 53 (see FIG. 11).

In FIGS. 17 to 19, solid arrows represent the magnetization directions of the magnetization pinned layers 52 of the MR elements 150. In the example shown in FIG. 17, the magnetization directions of the magnetization pinned layers 52 in each of the first and third resistor sections R111 and R113 are the U direction. The magnetization directions of the magnetization pinned layers 52 in each of the second and fourth resistor sections R112 and R114 are the −U direction. The free layer 54 in each of the plurality of MR elements 150 of the first detection circuit 110 has a shape anisotropy that sets the direction of the magnetization easy axis to a direction parallel to the V direction.

In the example shown in FIG. 18, the magnetization directions of the magnetization pinned layers 52 in each of the first and third resistor sections R121 and R123 are the V direction. The magnetization directions of the magnetization pinned layers 52 in each of the second and fourth resistor sections R122 and R124 are the —V direction. The free layer 54 in each of the plurality of MR elements 150 of the second detection circuit 120 has a shape anisotropy that sets the direction of the magnetization easy axis to a direction parallel to the U direction.

The free layer 54 in each of the plurality of MR elements 150 of the third detection circuit 130 has a shape anisotropy that sets the direction of the magnetization easy axis to a direction parallel to the V direction. The magnetization directions of the magnetization pinned layers 52 in the third detection circuit 130 will be described below.

Next, a specific structure of the magnetic sensor 101 will be described. The magnetic sensor 101 includes a substrate having a top surface, a first portion including the first detection circuit 110, a second portion including the second detection circuit 120, and a third portion including the third detection circuit 130. The top surface of the substrate is parallel to the XY plane. The first to third portions are formed on the substrate. The first portion and the second portion have a similar structure to that of the first chip 2 (except for the substrate 201) described in the first example embodiment. A plurality of MR elements 150 included in the first portion each have a shape long in the V direction. A plurality of MR elements 150 included in the second portion each have a shape long in the U direction. The first and second portions may or may not include the first coil 70 described in the first example embodiment.

Figure 20:
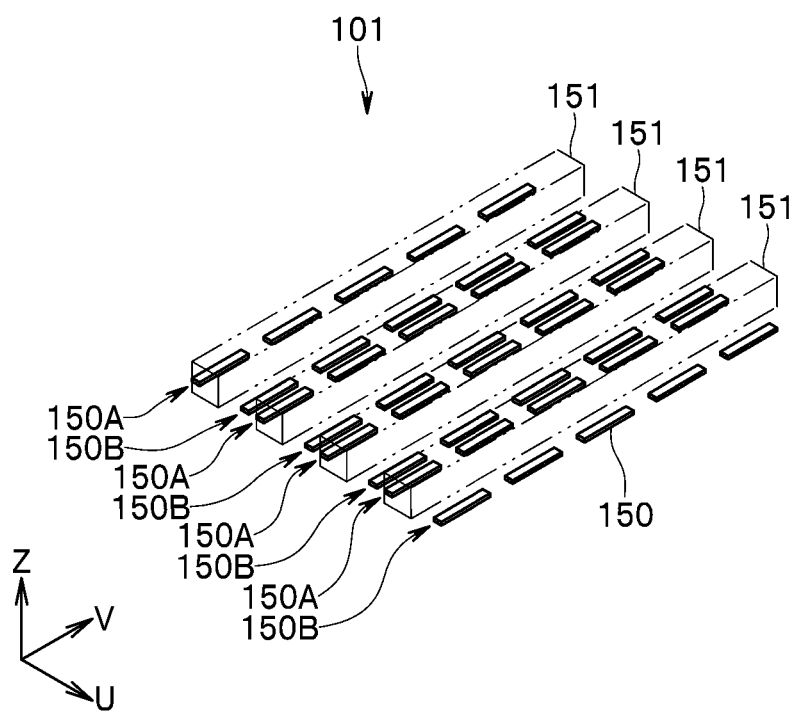
FIG. 20 is a perspective view showing a plurality of magnetoresistive elements and a plurality of yokes of the third example embodiment of the technology.
Figure 21:
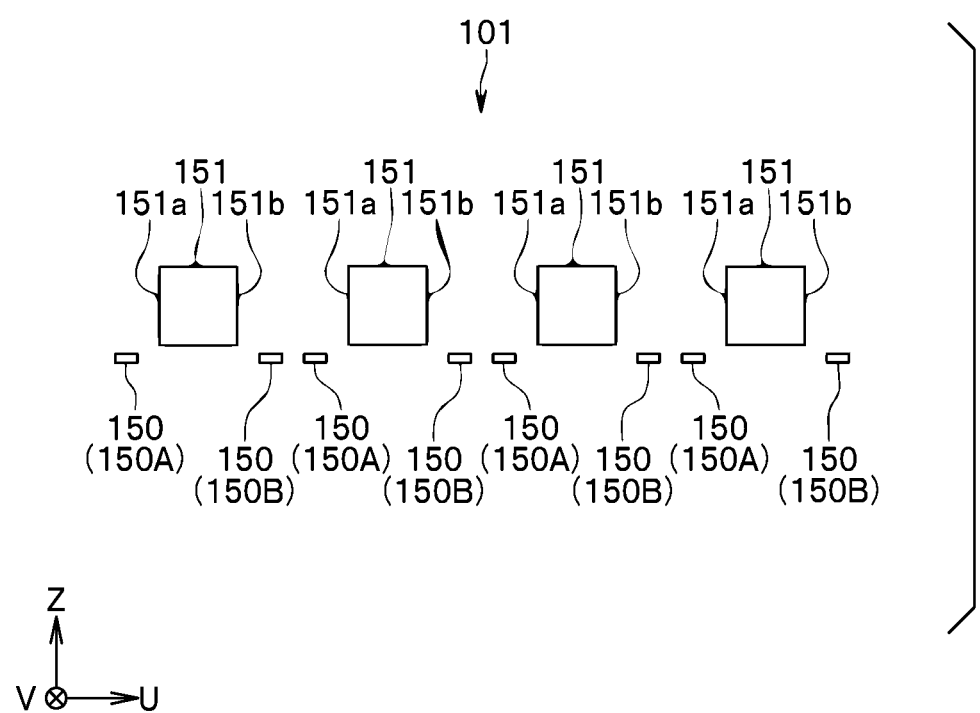
FIG. 21 is a side view showing the plurality of magnetoresistive elements and the plurality of yokes of the third example embodiment of the technology.

Next, a structure of the third portion of the magnetic sensor 101 will be described with reference to FIGS. 20 and 21. FIG. 20 is a perspective view showing a plurality of MR elements 150 and a plurality of yokes. FIG. 21 is a side view showing the plurality of MR elements 150 and the plurality of yokes.

The third portion has basically the same structure as that of the first portion. The third portion further includes a plurality of yokes 151 each formed of a soft magnetic body. Each of the yokes 151 may have a rectangular solid shape long in the V direction, for example. Each of the yokes 151 is configured to generate an output magnetic field when an input magnetic field including an input magnetic field component in the direction parallel to the Z direction is applied thereto. The output magnetic field includes an output magnetic field component that is in the direction parallel to the U direction and varies depending on the input magnetic field component.

Each of the yokes 151 has a first end face 151a and a second end face 151b located at both ends in the direction parallel to the U direction. The first end face 151a of each of the yokes 151 is located at the end of the yoke 151 in the −U direction, and the second end face 151b is located at the end of the yoke 151 in the U direction. The plurality of yokes 151 are arranged in the direction parallel to the U direction.

As shown in FIGS. 20 and 21, in the third portion, a plurality of MR elements 150 are arranged in a row along the first end face 150a, and a plurality of MR elements 150 are arranged in a row along the second end face 150b. The plurality of MR elements 150 arranged along the first end face 150a will hereinafter be denoted by the reference numeral 150A. The plurality of MR elements 150 arranged along the second end face 150b will be denoted by the reference numeral 150B. In the third portion, a plurality of MR elements 150A and a plurality of MR elements 150B are arranged so that rows of MR elements 150A and rows of MR elements 150B are alternately arranged in the direction parallel to the U direction. When seen from above, the plurality of MR elements 150A and the plurality of MR elements 150B do not need to overlap the plurality of yokes 151.

Although not shown in the drawings, the third portion further includes a plurality of first lower electrodes, a plurality of second lower electrodes, a plurality of first upper electrodes, and a plurality of second upper electrodes. The plurality of MR elements 150A are connected in series by the plurality of first lower electrodes and the plurality of first upper electrodes. The plurality of MR elements 150B are connected in series by the plurality of second lower electrodes and the plurality of second upper electrodes.

Next, the plurality of yokes 151 will be described in detail. When the direction of the input magnetic field component is in the Z direction, the output magnetic field components received by the plurality of MR elements 150A are in the U direction, and the output magnetic field components received by the plurality of MR elements 150B are in the −U direction. When the direction of the input magnetic field component is in the −Z direction, the output magnetic field components received by the plurality of MR elements 150A are in the −U direction, and the output magnetic field components received by the plurality of MR elements 150B are in the U direction.

Next, the first to third detection signals according to the example embodiment will be described. Initially, the first detection signal will be briefly described. The resistances of the respective resistor sections R111 to R114 of the first detection circuit 110 change in the same way as do the resistances of the respective resistor sections R11 to R14 of the first detection circuit 10 described in the first example embodiment. The first detection circuit 110 generates a signal corresponding to the electric potential of the signal output port E11 as a first detection signal S111, and generates a signal corresponding to the electric potential of the signal output port E12 as a first detection signal S112.

Next, the second detection signal will be described with reference to FIG. 18. As the strength of the component of the target magnetic field in the direction parallel to the V direction changes, the resistance of each of the resistor sections R121 to R124 of the second detection circuit 120 changes either so that the resistances of the resistor sections R121 and R123 increase and the resistances of the resistor sections R122 and R124 decrease or so that the resistances of the resistor sections R121 and R123 decrease and the resistances of the resistor sections R122 and R124 increase. Thereby the electric potential of each of the signal output ports E21 and E22 changes. The second detection circuit 120 generates a signal corresponding to the electric potential of the signal output port E21 as a second detection signal S121, and generates a signal corresponding to the electric potential of the signal output port E22 as a second detection signal S122.

Next, the third detection signal will be described with reference to FIGS. 19 to 21. The first resistor section R131 and the second resistor section R132 are constituted by the plurality of MR elements 150A. The third resistor section R133 and the fourth resistor section R134 are constituted by the plurality of MR elements 150B.

An area where the plurality of MR elements 150 constituting the third detection circuit 130 are arranged is divided into a first area and a second area. A plurality of MR elements 150A constituting the first resistor section R131 and a plurality of MR elements 150B constituting the fourth resistor section R134 may be located in the first area. A plurality of MR elements 150A constituting the second resistor section R132 and a plurality of MR elements 150B constituting the third resistor section R133 may be located in the second area.

The magnetization directions of the magnetization pinned layers 52 in each of the first and fourth resistor sections R131 and R134 are the U direction. The magnetization directions of the magnetization pinned layers 52 in each of the second and third resistor sections R112 and R113 are the −U direction.

When the direction of the input magnetic field component is in the Z direction, the output magnetic field components received by the plurality of MR elements 150A in the first and second resistor sections R131 and R132 are in the U direction, and the output magnetic field components received by the plurality of MR elements 150B in the third and fourth resistor sections R133 and R134 are in the −U direction. In such a case, the resistance of each of the plurality of MR elements 150A in the first resistor section R131 and the plurality of MR elements 150B in the third resistor section R133 decreases and the resistance of each of the first and third resistor sections R131 and R133 also decreases as compared to the state where there is no output magnetic field component. Moreover, the resistance of each of the plurality of MR elements 150A in the second resistor section R132 and the plurality of MR elements 150B in the fourth resistor section R134 increases and the resistances of the second and fourth resistor sections R132 and R134 also increase as compared to the state where there is no output magnetic field component.

When the direction of the input magnetic field component is in the −Z direction, the direction of the output magnetic field component and the changes in the resistances of the first to fourth resistor sections R131 to R134 become opposite from those in the above-described case where the direction of the input magnetic field component is in the Z direction.

As described above, changes in the direction and strength of the input magnetic field component cause the resistances of the resistor sections R131 to R134 of the third detection circuit 130 to change either so that the resistances of the resistor sections R131 and R133 increase and the resistances of the resistor sections R132 and R134 decrease, or so that the resistances of the resistor sections R131 and R133 decrease and the resistances of the resistor sections R132 and R134 increase. Thereby the electric potential of each of the signal output ports E31 and E32 changes. The third detection circuit 130 generates a signal corresponding to the electric potential of the signal output port E31 as a third detection signal S131, and generates a signal corresponding to the electric potential of the signal output port E32 as a third detection signal S132.

Figure 22:
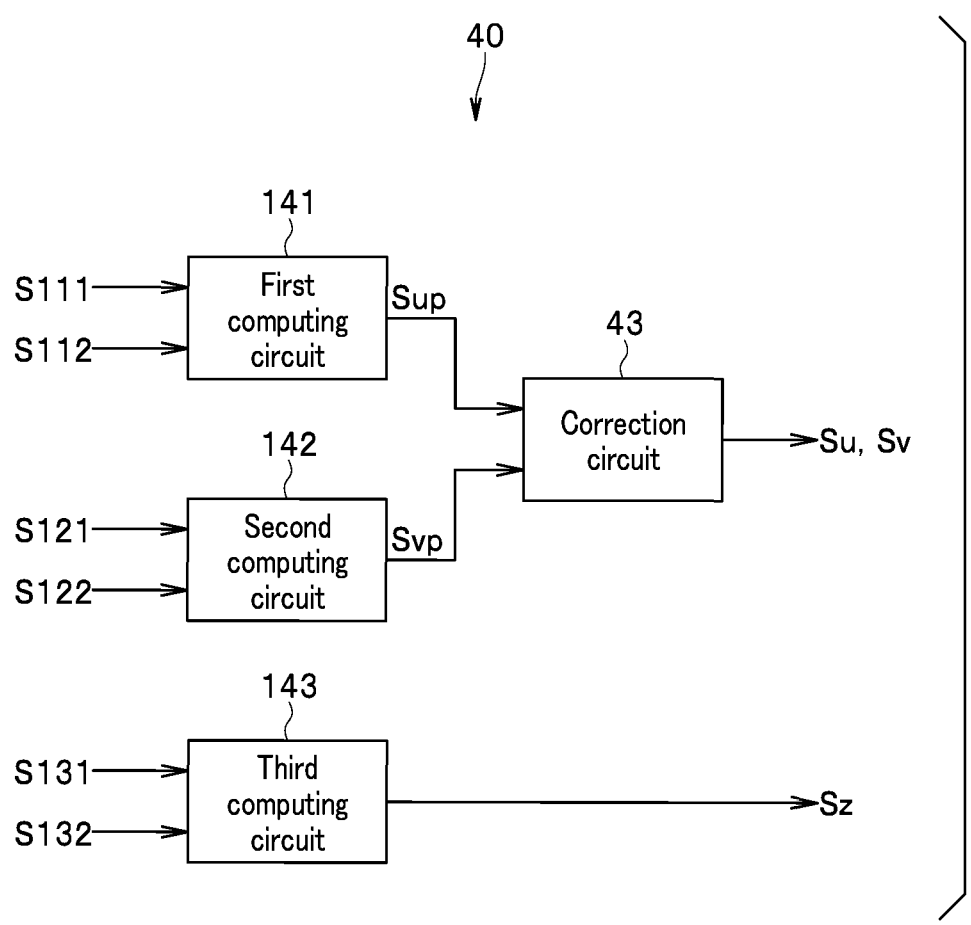
FIG. 22 is a functional block diagram showing a configuration of a processor of the third example embodiment of the technology.

Next, a configuration and operation of the processor 40 according to the example embodiment will be described. FIG. 22 is a functional block diagram showing the configuration of the processor 40 according to the example embodiment. In the example embodiment, the processor 40 is configured to generate a first detection value Su corresponding to the component of the target magnetic field in the direction parallel to the U direction based on the first detection signals S111 and S112, generate a second detection value Sv corresponding to the component of the target magnetic field in the direction parallel to the V direction based on the second detection signals S121 and S122, and generate a third detection value Sz corresponding to the component of the target magnetic field in the direction parallel to the Z direction based on the third detection signals S131 and S132.

The processor 40 according to the example embodiment includes a first computing circuit 141, a second computing circuit 142, and a third computing circuit 143, instead of the first and second computing circuits according to the first example embodiment. The first computing circuit 141 is configured to execute first generation processing. The content of the first generation processing according to the example embodiment is similar to that in the first example embodiment. More specifically, the first generation processing of the example embodiment is processing for generating a first initial detection value Sup corresponding to the first detection value Su using the first detection signals S111 and S112. The first computing circuit 141 generates the first initial detection value Sup by computing including determination of a difference S111-S112 between the first detection signal S111 and the first detection signal S112. The first initial detection value Sup may be the difference S111-S112 itself. The first initial detection value Sup may be a result of predetermined corrections, such as gain adjustment and offset adjustment, made on the difference S111-S112.

The second computing circuit 142 is configured to execute second generation processing. The content of the second generation processing of the example embodiment is different from that in the first example embodiment. The second generation processing of the example embodiment is processing for generating a second initial detection value Svp corresponding to the second detection value Sv using the second detection signals S121 and S122. The second computing circuit 142 generates the second initial detection value Svp by computing including determination of a difference S121-S122 between the second detection signal S121 and the second detection signal S122. The second initial detection value Svp may be the difference S121-S122 itself. The second initial detection value Svp may be a result of predetermined corrections, such as gain adjustment and offset adjustment, made on the difference S121-S122.

The third computing circuit 143 is configured to execute third generation processing. The third generation processing is processing for generating a third detection value Sz using the third detection signals S131 and S132. The third computing circuit 143 generates the third detection value Sz by computing including determination of a difference S131-S132 between the third detection signal S131 and the third detection signal S132. The third detection value Sz may be the difference S131-S132 itself. The third detection value Sz may be a result of predetermined corrections, such as gain adjustment and offset adjustment, made on the difference S131-S132.

In the example embodiment, the correction circuit 43 is configured not to generate the third detection value Sz. In the example embodiment, the content of the determination processing is also different from that in the first example embodiment. The determination processing of the example embodiment includes processing for determining the first detection value Su and the second detection value Sv but does not include processing for determining the third detection value Sz.

In the example embodiment, the correction circuit 43 executes the determination processing after alternately executing first correction processing and second correction processing. The correction circuit 43 may execute the first correction processing and the second correction processing once each, twice each, or three or more times each. The correction circuit 43 may update the second initial detection value Svp first. More specifically, the correction circuit 43 may execute the second correction processing for the first time before executing the first correction processing for the first time.

The configuration, operation, and effects of the present example embodiment are otherwise the same as those of the first example embodiment.

The technology is not limited to the foregoing example embodiments, and various modifications may be made thereto. For example, the magnetic sensor of the technology may be formed by integrating the first chip 2 and the second chip 3.

The second chip 3 may include only a second detection circuit configured to detect the component of the target magnetic field in the direction parallel to the V direction, instead of the second and third detection circuits 20 and 30. Alternatively, the second chip 3 may include a second detection circuit configured to detect the component of the target magnetic field in the direction parallel to the V direction and a third detection circuit configured to detect the component of the target magnetic field in the direction parallel to the Z direction, instead of the second and third detection circuits 20 and 30.

The second computing circuit 42 of the first example embodiment may be configured to be capable of executing the third processing of the second generation processing in addition to the first and second processing of the second generation processing. In such a case, the correction circuit 43 may execute second correction processing using the second and third initial detection values Svp and Szp generated by the second computing circuit 42 instead of the first and second values S1 and S2. The second correction processing may be processing for calculating (updating) the second initial detection value Svp by substituting the latest second initial detection value Svp and the latest first correction value Suc into a first equation expressed using the second initial detection value Svp and the first correction value Suc, and calculating (updating) the third initial detection value Szp by substituting the latest third initial detection value Szp and the latest first correction value Suc into a second equation expressed using the third initial detection value Szp and the first correction value Suc. The first equation may include computing including multiplication of the latest second initial detection value Svp by the first correction value Suc, and computing for adding the value obtained by the computing to the latest second initial detection value Svp or for subtracting the value from the latest second initial detection value Svp. The second equation may include computing including multiplication of the latest third initial detection value Szp by the first correction value Suc, and computing for adding the value obtained by the computing to the latest third initial detection value Szp or for subtracting the value from the latest third initial detection value Szp.

As described above, a magnetic sensor device according to one embodiment of the technology includes: a first detection circuit configured to detect a component of a target magnetic field in one direction and generate a first detection signal, the target magnetic field being a magnetic field to be detected; a second detection circuit configured to detect a component of the target magnetic field in another direction and generate a second detection signal; and a processor.

The processor is configured to execute first generation processing for generating a first initial detection value using the first detection signal, second generation processing for generating a second initial detection value using the second detection signal, first correction processing for correcting the first initial detection value using a second correction value generated from the latest second initial detection value, and updating the first initial detection value, second correction processing for correcting the second initial detection value using a first correction value generated from the latest first initial detection value, and updating the second initial detection value, and determination processing for determining the latest first initial detection value as a first detection value having a correspondence with a component of the target magnetic field parallel to a first reference direction, and determining the latest second initial detection value as a second detection value having a correspondence with a component of the target magnetic field parallel to a second reference direction. The processor executes the determination processing after alternately executing the first correction processing and the second correction processing.

In the magnetic sensor device according to the one embodiment of the technology, the processor may execute the first correction processing and the second correction processing twice each.

In the magnetic sensor device according to the one embodiment of the technology, the processor may execute the second correction processing for a first time before executing the first correction processing for a first time.

In the magnetic sensor device according to the one embodiment of the technology, the first correction value may be a value calculated by computing including multiplication of the latest first initial detection value by a first correction coefficient. The second correction value may be a value calculated by computing including multiplication of the latest second initial detection value by a second correction coefficient.

In the magnetic sensor device according to the one embodiment of the technology, the first detection circuit and the second detection circuit each may include a first magnetoresistive element and a second magnetoresistive element connected in series in a first path that is a path electrically connecting a first node and a second node, and a third magnetoresistive element and a fourth magnetoresistive element connected in series in a second path that is another path electrically connecting the first node and the second node. The first magnetoresistive element and the fourth magnetoresistive element may be connected to the first node. The second magnetoresistive element and the third magnetoresistive element may be connected to the second node. Each of the first to fourth magnetoresistive elements may include a magnetization pinned layer having a first magnetization whose direction is fixed, a free layer having a second magnetization whose direction is variable depending on the target magnetic field, and a gap layer located between the magnetization pinned layer and the free layer. A direction of a main component of the first magnetization in the first magnetoresistive element and that of a main component of the first magnetization in the third magnetoresistive element may be same. A direction of a main component of the first magnetization in the second magnetoresistive element and that of a main component of the first magnetization in the fourth magnetoresistive element may be same. The direction of the main component of the first magnetization in the second magnetoresistive element may be opposite to that of the main component of the first magnetization in the first magnetoresistive element. The direction of the main component of the first magnetization in the fourth magnetoresistive element may be opposite to that of the main component of the first magnetization in the third magnetoresistive element. In a case where the target magnetic field is not applied to the first and second detection circuits, a direction of a main component of the second magnetization in each of two of the first to fourth magnetoresistive elements may be opposite to that of a main component of the second magnetization in each of the other two of the first to fourth magnetoresistive elements. The gap layer may be a tunnel barrier layer.

In the magnetic sensor device according to the one embodiment of the technology, neither of the first detection circuit and the second detection circuit needs to include a shield.

In the magnetic sensor device according to the one embodiment of the technology, the first reference direction and the second reference direction may be both parallel to a reference plane and be orthogonal to each other.

In the magnetic sensor device according to the one embodiment of the technology, the direction of the component of the target magnetic field for the first detection circuit to detect may be a direction parallel to a reference plane. The direction of the component of the target magnetic field for the second detection circuit to detect may be a direction inclined relative to the reference plane.

The magnetic sensor device according to the one embodiment of the technology may further include a third detection circuit. The third detection circuit may be configured to detect a component of the target magnetic field in a direction inclined relative to the reference plane and different from the direction of the component of the target magnetic field for the second detection circuit to detect, and generate a third detection signal. The second generation processing may be processing for generating the second initial detection value and a third initial detection value using the second detection signal and the third detection signal. The second correction processing may be processing for correcting the second initial detection value and the third initial detection value using the first correction value, and updating the second initial detection value and the third initial detection value. The determination processing may further determine the latest third initial detection value as a third detection value having a correspondence with a component of the target magnetic field perpendicular to the reference plane.

If the magnetic sensor device according to the one embodiment of the technology includes the third detection circuit, the second generation processing may include first processing for generating a first value using the second detection signal, second processing for generating a second value using the third detection signal, and third processing for generating the second initial detection value and the third initial detection value using the first value and the second value. The second correction processing may substantially include the third processing. In such a case, the processor may execute the second correction processing for a first time and the first correction processing for a first time in this order after executing the first processing and the second processing. The second correction processing may include fourth processing for correcting the first value and the second value using the first correction value, fifth processing for generating the second initial detection value and the third initial detection value using the first value and the second value corrected by the fourth processing, and sixth processing for updating the second initial detection value and the third initial detection value using the second initial detection value and the third initial detection value generated by the fifth processing.

If the magnetic sensor device according to the one embodiment of the technology includes the third detection circuit, each of the first to third detection circuits may include a first magnetoresistive element and a second magnetoresistive element connected in series in a first path that is a path electrically connecting a first node and a second node, and a third magnetoresistive element and a fourth magnetoresistive element connected in series in a second path that is another path electrically connecting the first node and the second node. The first magnetoresistive element and the fourth magnetoresistive element may be connected to the first node. The second magnetoresistive element and the third magnetoresistive element may be connected to the second node. Each of the first to fourth magnetoresistive elements may include a magnetization pinned layer having a first magnetization whose direction is fixed, a free layer having a second magnetization whose direction is variable depending on the target magnetic field, and a gap layer located between the magnetization pinned layer and the free layer. A direction of a main component of the first magnetization in the first magnetoresistive element and that of a main component of the first magnetization in the third magnetoresistive element may be same. A direction of a main component of the first magnetization in the second magnetoresistive element and that of a main component of the first magnetization in the fourth magnetoresistive element may be same. The direction of the main component of the first magnetization in the second magnetoresistive element may be opposite to that of the main component of the first magnetization in the first magnetoresistive element. The direction of the main component of the first magnetization in the fourth magnetoresistive element is opposite to that of the main component of the first magnetization in the third magnetoresistive element. In a case where the target magnetic field is not applied to the first to third detection circuits, a direction of a main component of the second magnetization in each of two of the first to fourth magnetoresistive elements may be opposite to that of a main component of the second magnetization in each of the other two of the first to fourth magnetoresistive elements. The gap layer may be a tunnel barrier layer.

If the magnetic sensor device according to the one embodiment of the technology includes the third detection circuit, none of the first to third detection circuits needs to include a shield.

If the magnetic sensor device according to the one embodiment of the technology includes the third detection circuit, the magnetic sensor device according to the one embodiment of the technology may further include a first chip including the first detection circuit and a second chip including the second detection circuit and the third detection circuit.

The magnetic sensor device according to the one embodiment of the technology may further include a third detection circuit, and the third detection circuit may be configured to detect a component of the target magnetic field perpendicular to a reference plane and generate a third detection signal. The direction of the component of the target magnetic field for the first detection circuit to detect may be a first direction parallel to the reference plane. The direction of the component of the target magnetic field for the second detection circuit to detect may be a second direction parallel to the reference plane. The second generation processing may be processing for generating the second initial detection value and a third detection value using the second detection signal and the third detection signal. The third detection value may have a correspondence with the component of the target magnetic field perpendicular to the reference plane.

Obviously, various modification examples and variations of the technology are possible in the light of the above teachings. Thus, it is to be understood that, within the scope of the appended claims and equivalents thereof, the technology may be practiced in other embodiments than the foregoing example embodiments.

What is claimed is:

1. A magnetic sensor device comprising:
a first detection circuit configured to detect a component of a target magnetic field in one direction and generate a first detection signal, the target magnetic field being a magnetic field to be detected;
a second detection circuit configured to detect a component of the target magnetic field in another direction and generate a second detection signal; and
a processor, wherein
the processor is configured to execute
first generation processing for generating a first initial detection value using the first detection signal,
second generation processing for generating a second initial detection value using the second detection signal,
first correction processing for correcting the first initial detection value using a second correction value generated from a latest one of the second initial detection value, and updating the first initial detection value,
second correction processing for correcting the second initial detection value using a first correction value generated from a latest one of the first initial detection value, and updating the second initial detection value, and
determination processing for determining the latest one of the first initial detection value as a first detection value having a correspondence with a component of the target magnetic field parallel to a first reference direction, and determining the latest one of the second initial detection value as a second detection value having a correspondence with a component of the target magnetic field parallel to a second reference direction, and
the processor executes the determination processing after alternately executing the first correction processing and the second correction processing,
the magnetic sensor device further comprising a third detection circuit, wherein:
the direction of the component of the target magnetic field for the first detection circuit to detect is a direction parallel to a reference plane;
the direction of the component of the target magnetic field for the second detection circuit to detect is a direction inclined relative to the reference plane;
the third detection circuit is configured to detect a component of the target magnetic field in a direction inclined relative to the reference plane and different from the direction of the component of the target magnetic field for the second detection circuit to detect, and generate a third detection signal;
the second generation processing is processing for generating the second initial detection value and a third initial detection value using the second detection signal and the third detection signal;
the second correction processing is processing for correcting the second initial detection value and the third initial detection value using the first correction value, and updating the second initial detection value and the third initial detection value; and
the determination processing further determines a latest one of the third initial detection value as a third detection value having a correspondence with a component of the target magnetic field perpendicular to the reference plane.

2. The magnetic sensor device according to claim 1, wherein the processor executes the first correction processing and the second correction processing twice each.

3. The magnetic sensor device according to claim 1, wherein the processor executes the second correction processing for a first time before executing the first correction processing for a first time.

4. The magnetic sensor device according to claim 1, wherein:
the first correction value is a value calculated by computing including multiplication of the latest one of the first initial detection value by a first correction coefficient; and
the second correction value is a value calculated by computing including multiplication of the latest one of the second initial detection value by a second correction coefficient.

5. The magnetic sensor device according to claim 1, wherein:
the first detection circuit and the second detection circuit each include
a first magnetoresistive element and a second magnetoresistive element connected in series in a first path that is a path electrically connecting a first node and a second node, and
a third magnetoresistive element and a fourth magnetoresistive element connected in series in a second path that is another path electrically connecting the first node and the second node;
the first magnetoresistive element and the fourth magnetoresistive element are connected to the first node;
the second magnetoresistive element and the third magnetoresistive element are connected to the second node;
each of the first to fourth magnetoresistive elements includes a magnetization pinned layer having a first magnetization whose direction is fixed, a free layer having a second magnetization whose direction is variable depending on the target magnetic field, and a gap layer located between the magnetization pinned layer and the free layer;
a direction of a main component of the first magnetization in the first magnetoresistive element and a direction of a main component of the first magnetization in the third magnetoresistive element are same;
a direction of a main component of the first magnetization in the second magnetoresistive element and a direction of a main component of the first magnetization in the fourth magnetoresistive element are same;
the direction of the main component of the first magnetization in the second magnetoresistive element is opposite to the direction of the main component of the first magnetization in the first magnetoresistive element;
the direction of the main component of the first magnetization in the fourth magnetoresistive element is opposite to the direction of the main component of the first magnetization in the third magnetoresistive element; and
in a case where the target magnetic field is not applied to the first and second detection circuits, a direction of a main component of the second magnetization in each of two of the first to fourth magnetoresistive elements is opposite to a direction of a main component of the second magnetization in each of the other two of the first to fourth magnetoresistive elements.

6. The magnetic sensor device according to claim 5, wherein the gap layer is a tunnel barrier layer.

7. The magnetic sensor device according to claim 1, wherein neither of the first detection circuit and the second detection circuit includes a shield.

8. The magnetic sensor device according to claim 1, wherein the first reference direction and the second reference direction are both parallel to a reference plane and are orthogonal to each other.

9. The magnetic sensor device according to claim 1, wherein:
the second generation processing includes first processing for generating a first value using the second detection signal, second processing for generating a second value using the third detection signal, and third processing for generating the second initial detection value and the third initial detection value using the first value and the second value;
the second correction processing substantially includes the third processing; and
the processor executes the second correction processing for a first time and the first correction processing for a first time in this order after executing the first processing and the second processing.

10. The magnetic sensor device according to claim 1, wherein:
the second generation processing includes first processing for generating a first value using the second detection signal, second processing for generating a second value using the third detection signal, and third processing for generating the second initial detection value and the third initial detection value using the first value and the second value; and
the second correction processing includes fourth processing for correcting the first value and the second value using the first correction value, and updating the first value and the second value, fifth processing for generating the second initial detection value and the third initial detection value using a latest one of the first value and a latest one of the second value, and sixth processing for updating the second initial detection value and the third initial detection value using the second initial detection value and the third initial detection value generated by the fifth processing.

11. The magnetic sensor device according to claim 1, wherein:
each of the first to third detection circuits includes
a first magnetoresistive element and a second magnetoresistive element connected in series in a first path that is a path electrically connecting a first node and a second node, and
a third magnetoresistive element and a fourth magnetoresistive element connected in series in a second path that is another path electrically connecting the first node and the second node;
the first magnetoresistive element and the fourth magnetoresistive element are connected to the first node;
the second magnetoresistive element and the third magnetoresistive element are connected to the second node;
each of the first to fourth magnetoresistive elements includes a magnetization pinned layer having a first magnetization whose direction is fixed, a free layer having a second magnetization whose direction is variable depending on the target magnetic field, and a gap layer located between the magnetization pinned layer and the free layer;
a direction of a main component of the first magnetization in the first magnetoresistive element and a direction of a main component of the first magnetization in the third magnetoresistive element are same;
a direction of a main component of the first magnetization in the second magnetoresistive element and a direction of a main component of the first magnetization in the fourth magnetoresistive element are same;
the direction of the main component of the first magnetization in the second magnetoresistive element is opposite to the direction of the main component of the first magnetization in the first magnetoresistive element;
the direction of the main component of the first magnetization in the fourth magnetoresistive element is opposite to the direction of the main component of the first magnetization in the third magnetoresistive element; and
in a case where the target magnetic field is not applied to the first to third detection circuits, a direction of a main component of the second magnetization in each of two of the first to fourth magnetoresistive elements is opposite to a direction of a main component of the second magnetization in each of the other two of the first to fourth magnetoresistive elements.

12. The magnetic sensor device according to claim 11, wherein the gap layer is a tunnel barrier layer.

13. The magnetic sensor device according to claim 1, wherein none of the first to third detection circuits includes a shield.

14. The magnetic sensor device according to claim 1, further comprising a first chip including the first detection circuit and a second chip including the second detection circuit and the third detection circuit.

15. A magnetic sensor device comprising:
a first detection circuit configured to detect a component of a target magnetic field in one direction and generate a first detection signal, the target magnetic field being a magnetic field to be detected;
a second detection circuit configured to detect a component of the target magnetic field in another direction and generate a second detection signal; and
a processor, wherein
the processor is configured to execute
first generation processing for generating a first initial detection value using the first detection signal,
second generation processing for generating a second initial detection value using the second detection signal,
first correction processing for correcting the first initial detection value using a second correction value generated from a latest one of the second initial detection value, and updating the first initial detection value,
second correction processing for correcting the second initial detection value using a first correction value generated from a latest one of the first initial detection value, and updating the second initial detection value, and
determination processing for determining the latest one of the first initial detection value as a first detection value having a correspondence with a component of the target magnetic field parallel to a first reference direction, and determining the latest one of the second initial detection value as a second detection value having a correspondence with a component of the target magnetic field parallel to a second reference direction, and the processor executes the determination processing after alternately executing the first correction processing and the second correction processing, the magnetic sensor device further comprising a third detection circuit, wherein:

the direction of the component of the target magnetic field for the first detection circuit to detect is a first direction parallel to a reference plane;

the direction of the component of the target magnetic field for the second detection circuit to detect is a second direction parallel to the reference plane;

the third detection circuit is configured to detect a component of the target magnetic field perpendicular to the reference plane and generate a third detection signal;

the second generation processing is processing for generating the second initial detection value and a third detection value using the second detection signal and the third detection signal; and the third detection value has a correspondence with the component of the target magnetic field perpendicular to the reference plane.

* * * * *